United States Patent
Balasubramanian et al.

(10) Patent No.: US 7,423,451 B2
(45) Date of Patent: Sep. 9, 2008

(54) SYSTEM-ON-A-CHIP INTEGRATED CIRCUIT INCLUDING DUAL-FUNCTION ANALOG AND DIGITAL INPUTS

(75) Inventors: Rabindranath Balasubramanian, Dublin, CA (US); Limin Zhu, Fremont, CA (US); Theodore Speers, San Jose, CA (US); Gregory Bakker, San Jose, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 11/551,857

(22) Filed: Oct. 23, 2006

(65) Prior Publication Data

US 2007/0046325 A1  Mar. 1, 2007

Related U.S. Application Data

(63) Continuation of application No. 10/877,043, filed on Jun. 25, 2004, now Pat. No. 7,129,746, which is a continuation-in-part of application No. 10/843,701, filed on May 10, 2004, now Pat. No. 7,170,315.

(60) Provisional application No. 60/491,788, filed on Jul. 31, 2003.

(51) Int. Cl.
*H03K 19/173* (2006.01)
(52) U.S. Cl. .............................. 326/38; 326/39; 326/26; 710/100
(58) Field of Classification Search ................... 326/38, 326/39
See application file for complete search history.

(56) References Cited

U.S. PATENT DOCUMENTS

| | | | |
|---|---|---|---|
| 4,503,494 A | 3/1985 | Hamilton et al. |
| 4,513,258 A | 4/1985 | Jamiolkowski et al. |
| 4,758,745 A | 7/1988 | Elgamal et al. |
| 4,855,954 A | 8/1989 | Turner et al. |
| 4,870,302 A | 9/1989 | Freeman |
| 4,879,688 A | 11/1989 | Turner et al. |
| 5,101,122 A | 3/1992 | Shinonara |
| 5,132,571 A | 7/1992 | McCollum |
| 5,237,218 A | 8/1993 | Josephson et al. |
| 5,237,699 A | 8/1993 | Little et al. |
| 5,336,951 A | 8/1994 | Josephson et al. |
| 5,451,912 A | 9/1995 | Torode |

(Continued)

OTHER PUBLICATIONS

Author: Anonymous, 4-Pin μP Voltage Monitors with Manual Reset Input, Maxim Integrated Products, document 19-0411; Rev 3; Mar. 1999, pp. 1-8.

(Continued)

*Primary Examiner*—Vibol Tan
(74) *Attorney, Agent, or Firm*—Lewis and Roca LLP

(57) ABSTRACT

An integrated circuit includes a plurality of inputs, a plurality of output pads, a programmable logic block, an analog circuit block, an analog-to-digital converter programmably coupleable to individual analog circuits in the analog circuit block, and an interconnect architecture programmably coupling selected ones of the plurality of inputs, the plurality of outputs, the programmable logic block, the analog circuit block, and the analog-to-digital converter. At least one of the inputs may be programmably configured as one of a digital input programmably coupleable to elements in the programmable logic block or as an analog input to an analog circuit in the analog circuit block.

11 Claims, 17 Drawing Sheets

U.S. PATENT DOCUMENTS

| | | | |
|---|---|---|---|
| 5,559,449 | A | 9/1996 | Padoan et al. |
| 5,563,526 | A | 10/1996 | Hastings et al. |
| 5,638,418 | A | 6/1997 | Douglass et al. |
| 5,684,434 | A | 11/1997 | Mann et al. |
| 5,687,325 | A | 11/1997 | Chang |
| 5,811,987 | A | 9/1998 | Ashmore, Jr. et al. |
| 5,821,776 | A | 10/1998 | McGowan |
| 5,877,656 | A | 3/1999 | Mann et al. |
| 5,889,701 | A | 3/1999 | Kang et al. |
| 5,949,987 | A | 9/1999 | Curd et al. |
| 5,999,014 | A | 12/1999 | Jacobson et al. |
| 6,034,541 | A | 3/2000 | Kopec, Jr. et al. |
| 6,091,641 | A | 7/2000 | Zink |
| 6,104,257 | A | 8/2000 | Mann |
| 6,134,707 | A | 10/2000 | Herrmann et al. |
| 6,145,020 | A | 11/2000 | Barnett |
| 6,150,837 | A | 11/2000 | Beal et al. |
| 6,191,660 | B1 | 2/2001 | Mar et al. |
| 6,243,842 | B1 | 6/2001 | Slezak et al. |
| 6,260,087 | B1 | 7/2001 | Chang |
| 6,272,646 | B1 | 8/2001 | Rangasayee et al. |
| 6,304,099 | B1 | 10/2001 | Tang et al. |
| 6,334,208 | B1 | 12/2001 | Erickson |
| 6,346,905 | B1 | 2/2002 | Ottini et al. |
| 6,356,107 | B1 | 3/2002 | Tang et al. |
| 6,389,321 | B2 | 5/2002 | Tang et al. |
| 6,396,168 | B2 | 5/2002 | Ghezzi et al. |
| 6,408,432 | B1 | 6/2002 | Herrmann et al. |
| 6,414,368 | B1 | 7/2002 | May et al. |
| 6,415,344 | B1 | 7/2002 | Jones et al. |
| 6,433,645 | B1 | 8/2002 | Mann et al. |
| 6,442,068 | B1 | 8/2002 | Bartoli et al. |
| 6,483,344 | B2 | 11/2002 | Gupta |
| 6,490,714 | B1 | 12/2002 | Kurniawan et al. |
| 6,515,551 | B1 | 2/2003 | Mar et al. |
| 6,526,557 | B1 | 2/2003 | Young et al. |
| 6,552,935 | B2 | 4/2003 | Fasoli |
| 6,594,192 | B1 | 7/2003 | McClure |
| 6,600,355 | B1 | 7/2003 | Nguyen |
| 6,614,320 | B1 | 9/2003 | Sullam et al. |
| 6,651,199 | B1 | 11/2003 | Shokouhi |
| 6,674,332 | B1 | 1/2004 | Wunner et al. |
| 6,724,220 | B1 | 4/2004 | Snyder et al. |
| 6,748,577 | B2 | 6/2004 | Bal |
| 6,753,739 | B1 | 6/2004 | Mar et al. |
| 6,924,709 | B2 | 8/2005 | Bashar |
| 7,102,391 | B1* | 9/2006 | Sun et al. .................. 327/10 |
| 7,129,746 | B1 | 10/2006 | Balasubramanian et al. |
| 7,298,178 | B1* | 11/2007 | Sun et al. .................. 327/10 |
| 2001/0030554 | A1 | 10/2001 | Ghezzi et al. |
| 2002/0007467 | A1 | 1/2002 | Ma et al. |
| 2002/0108006 | A1 | 8/2002 | Snyder |
| 2003/0001614 | A1 | 1/2003 | Singh et al. |
| 2003/0005402 | A1 | 1/2003 | Bal |
| 2003/0074637 | A1 | 4/2003 | Pavesi et al. |
| 2003/0210585 | A1 | 11/2003 | Bernardi et al. |
| 2003/0210599 | A1 | 11/2003 | McClure |
| 2003/0214321 | A1 | 11/2003 | Swami et al. |
| 2004/0008055 | A1 | 1/2004 | Khanna et al. |
| 2004/0036500 | A1 | 2/2004 | Bratt |
| 2004/0046761 | A1 | 3/2004 | Hellman et al. |

OTHER PUBLICATIONS

Author: Anonymous, "Fan Controller and Remote Temperature Sensor with SMBus Serial Interface" for MAX1669, Maxim Integrated Products, document 19-1574; Rev 0; Jan. 2000, pp. 1-8.

Author: Anonymous, "Precision RESET Controller and 4K I2C Memory With Both RESET and RESET Outputs" for S24042/S24043, Summit Microelectronics, Inc., document 2011 2.0 May 2, 2000, pp. 1-14.

Author: Anonymous, "SOT23, Low-Power µP Supervisory Circuits with Battery Backup and Chip-Enable Gating" for MAX6365-MAX6368, Maxim Integrated Products, document 19-1658; Rev 1; Jun. 2001, pp. 1-15.

Author: Anonymous, "Cypress MicroSystems PsoC Microcontrollers Now Available in Volume", Cypress Semiconductor Corporation Press Release Sep. 5, 2001 [Internet: mhtml:file://D:\Act401\Cypress%20Semiconductor%20Corporation.mht].

Author: Anonymous, "nvSRAM—SRAM and EEPROM within a single chip" ZMD AG, pp. 1-4, Oct. 2001.

Author: Anonymous, "Intelligent Temperature Monitor and Dual PWM Fan Controller" for ADM1031, Analog Devices, pp. 1-32, 2003, no month.

Author: Anonymous, "LM63 ±1° C/±3° C. Accurate Remote Diode Digital Temperature Sensor with Integrated Fan Control", National Semiconductor Corporation, document DS200570, pp. 1-28, May 2003.

Author: Anonymous, "PSoC™ Configurable Mixed-Signal Array with On-board Controller", CY8C25122, CY8C26233, CY8C26443, CY8C26643, Device Data Sheet for Silicon Revision D, Cypress MicroSystems Document #: 38-1201 CY Rev. *B CMS Rev. 3.22, pp. 1-150, Aug. 18, 2003.

Author: Anonymous, "PSoC™ Mixed Signal Array", Preliminary Data Sheet for CY8C29466, CY8C29566, CY8C29666, and CY8C29866, Cypress MicroSystems Document No. 38-12013 Rev. *D., pp. 1-41, Jun. 2004.

* cited by examiner

SYSTEM-ON-A-CHIP INTEGRATED CIRCUIT INCLUDING DUAL-FUNCTION ANALOG AND DIGITAL INPUTS

CROSS-REFERENCE TO RELATED APPLICATIONS

This application is a Continuation of co-pending U.S. patent application Ser. No. 10/877,043, filed Jun. 25, 2004, now issued as U.S. Pat. No. 7,129,746, which is a Continuation-in-Part of co-pending U.S. patent application Ser. No. 10/843,701, filed May 10, 2004, now issued as U.S. Pat. No. 7,170,315, and claims priority from U.S. Provisional Patent Application Ser. No. 60/491,788, filed Jul. 31, 2003.

BACKGROUND OF THE INVENTION

1. Field of the Invention

The present invention relates to integrated circuits. More particularly, the present invention relates to a system-on-a-chip integrated circuit device including dual-purpose analog and digital inputs.

2. Background

Field-programmable gate array (FPGA) integrated circuits are known in the art. An FPGA comprises any number of logic modules, an interconnect-routing architecture and programmable elements that may be programmed to selectively interconnect the logic modules to one another and to define the functions of the logic modules. To implement a particular circuit function, the circuit is mapped into the array and the appropriate programmable elements are programmed to implement the necessary wiring connections that form the user circuit.

An FPGA includes an array of general-purpose logic circuits, called cells or logic blocks, whose functions are programmable. Programmable buses link the cells to one another. The cell types may be small multifunction circuits (or configurable functional blocks or groups) capable of realizing Boolean functions of multiple variables. The cell types are not restricted to gates. For example, configurable functional groups typically include memory cells and connection transistors that may be used to configure logic functions such as addition, subtraction, etc., inside of the FPGA. A cell may also contain a plurality of flip-flops. Two types of logic cells found in FPGA devices are those based on multiplexers and those based on programmable read only memory (PROM) table-lookup memories. Erasable FPGAs can be reprogrammed many times. This technology is especially convenient when developing and debugging a prototype design for a new product and for small-scale manufacture.

An FPGA circuit can be programmed to implement virtually any set of digital functions. Input signals are processed by the programmed circuit to produce the desired set of outputs. Such inputs flow from the user's system, through input buffers and through the circuit, and finally back out the user's system via output buffers referred to as input/output ports (I/Os). Such buffers provide any or all of the following input/output (I/O) functions: voltage gain, current gain, level translation, delay, signal isolation or hysteresis. The input/output ports provide the access points for communication between chips. I/O ports vary in complexity depending on the FPGA.

Recent advances in user-programmable interconnect technology have resulted in the development of FPGAs which may be customized by a user to perform a wide variety of combinatorial and sequential logic functions. Numerous architectures for such integrated circuits are known. Examples of such architectures are found disclosed in U.S. Pat. No. 4,870,302 to Freeman, U.S. Pat. No. 4,758,745 to El Gamal et al., and U.S. Pat. No. 5,132,571 to McCollum et al. The architecture employed in a particular FPGA integrated circuit will determine the richness and density of the possible interconnections that can be made among the various circuit elements disposed on the integrated circuit and thus profoundly affect its usefulness.

Traditionally, FPGAs and other programmable logic devices (PLDs) have been limited to providing digital logic functions programmable by a user. Recently, however, FPGA manufacturers have experimented with adding application specific integrated circuit (ASIC) blocks onto their devices (See, e.g., U.S. Pat. No 6,150,837). Such ASIC blocks have included analog circuits (see U.S. Pat. No. 5,821,776). In addition, ASIC manufacturers have embedded programmable logic blocks in their devices to add programmable functionality to otherwise hardwired devices (See, e.g., devices offered (or formerly offered) by Triscend Corporation, Adaptive Silicon Inc., and Chameleon Systems.

Currently, devices are known that include both analog and digital functions. Such devices typically have separate dedicated pins for the analog and digital input and output functions.

SUMMARY OF THE INVENTION

An integrated circuit includes a plurality of inputs, a plurality of outputs, a programmable logic block, an analog circuit block, an analog-to-digital converter programmably coupleable to individual analog circuits in the analog circuit block, and an interconnect architecture programmably coupling selected ones of the plurality of inputs, the plurality of outputs, the programmable logic block, the analog circuit block, and the analog-to-digital converter. At least one of the inputs may be programmably configured as one of a digital input programmably coupleable to elements in the programmable logic block or as an analog input to an analog circuit in the analog circuit block.

A better understanding of the features and advantages of the present invention will be obtained by reference to the following detailed description of the invention and accompanying drawings, which set forth an illustrative embodiment in which the principles of the invention are utilized.

DETAILED DESCRIPTION

Those of ordinary skill in the art will realize that the following description of the present invention is illustrative only and not in any way limiting. Other embodiments of the invention will readily suggest themselves to such skilled persons.

The term "system-on-a-chip" or "SOC" generally refers to an integrated circuit device that includes multiple types of integrated circuits on a single die, where the circuits are of types that have traditionally been constructed on separate silicon wafers.

Figure 1:
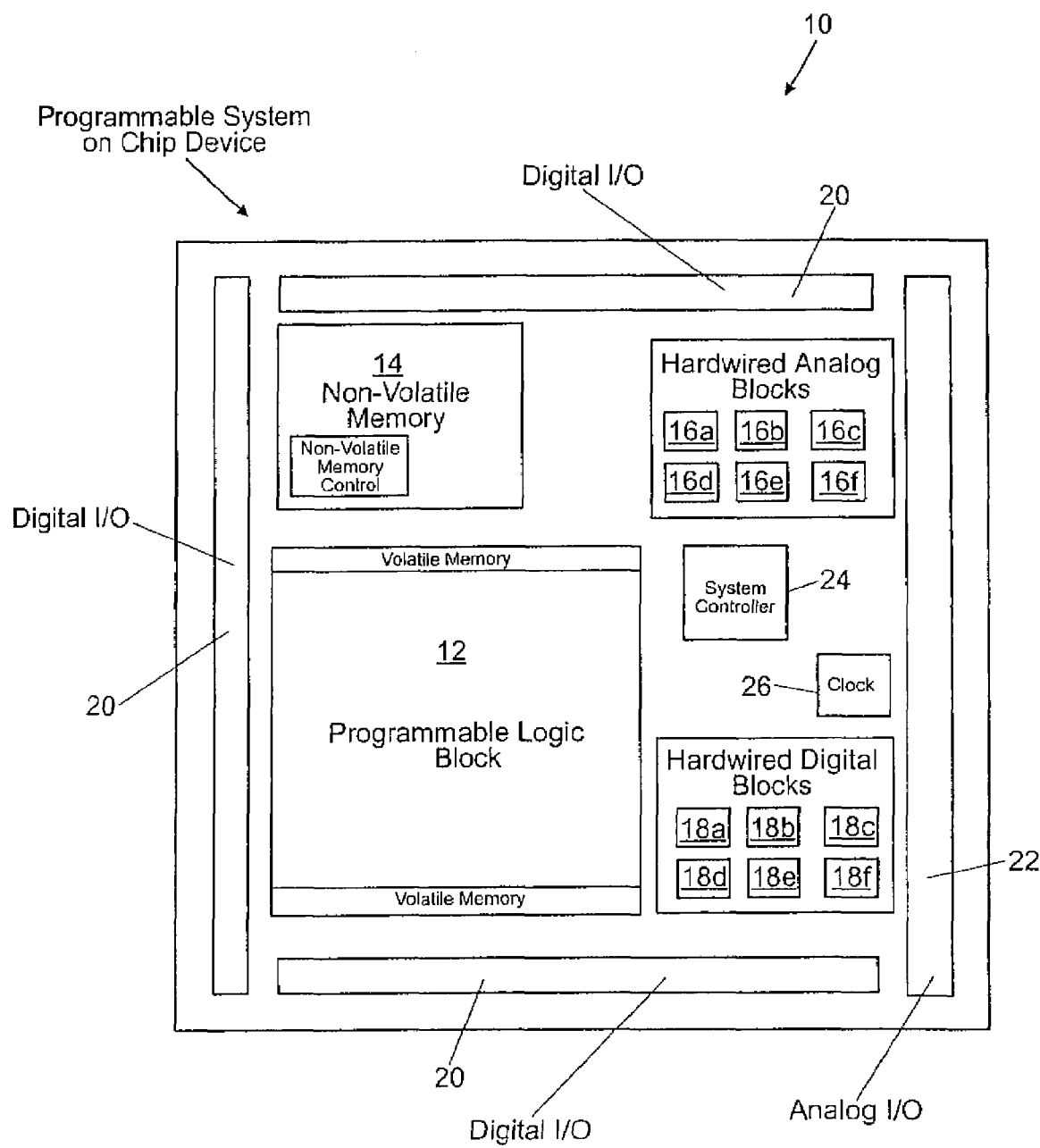
FIG. 1 is a block diagram of one illustrative embodiment of a system-on-a-chip according to one aspect of the present invention.

An SOC 10 according to the present invention design is shown generally in a block-diagram architectural level drawing in FIG. 1, which shows its main components. As shown in FIG. 1, an illustrative embodiment of the present invention is a system-on-a-chip integrated circuit 10 that includes a programmable logic block 12, at least one non-volatile memory block 14, analog ASIC circuit blocks 16a through 16f, digital ASIC circuit blocks 18a through 18f, digital input/output ("I/O") circuit blocks 20 and analog I/O circuit blocks 22. ASIC refers to "application specific integrated circuits" and is used to refer to circuit blocks that are largely hardwired, in contrast to those that are programmable, writeable, or otherwise able to be modified or configured after manufacturing of the device. System-on-a-chip integrated circuit 10 also includes a system controller circuit block 24 and a clock circuit 26.

Programmable logic block 12 may be an FPGA array. FPGA arrays are well known in the art, and it is contemplated for purposes of the present invention that any type of FPGA circuit block may be employed in the system-on-a-chip integrated circuit 10 of the present invention. The number of data inputs and outputs and the number of implementable combinatorial and sequential logic functions will depend on the particular design of FPGA circuit used in the FPGA array. Persons of ordinary skill in the art will appreciate that other programmable logic blocks such as complex programmable logic devices (CPLD) and other programmable logic blocks may be used in the present invention.

Non-volatile memory block 14 may be formed from an array of, as a non-limiting example, flash memory cells and a memory controller for the array. Flash memory cells are well known in the art and the present invention is not limited to use of any particular kind of flash memory cells or other non-volatile memory technology, such as nanocrystal, SONOS, solid-electrolyte switching devices, and other types as will be appreciated by persons of ordinary skill in the art. Persons of ordinary skill in the art will appreciate that, in some embodiments of the present invention, non-volatile memory block 14 may be segmented into a plurality of separately addressable arrays, each with its own memory controller. The number of data inputs and outputs and address inputs will depend on the size of the array used.

Analog ASIC circuit blocks 16a through 16f are illustrated in FIG. 1, although persons of ordinary skill in the art will observe that the provision of six analog ASIC circuit blocks 16a through 16f in FIG. 1 is merely illustrative and in no way limiting. Actual embodiments of system-on-a-chip integrated circuits according to the present invention may have an arbitrary number of analog ASIC circuit blocks. Analog ASIC circuit blocks 16a through 16f may alternatively be described as "hardwired," "mask programmable," or "ASIC" circuits or circuit blocks. These analog blocks are also referred to as "analog peripherals," and may include, as non-limiting examples, a digital-to-analog converter (DAC), an analog-to-digital converter (ADC), an Analog Pulse Width Modulator (PWM), a MOSFET Controller, a Voltage Reference circuit, a Low-dropout (LDO) regulator, an Analog multiplexer (MUX), or an RF Transceiver. In addition to the more general-purpose types of analog blocks described above, stand alone analog circuit blocks for more specific functions may be provided, as described above. For example, a stand-alone hardwired current monitor, a stand-alone hardwired temperature monitor, or a stand-alone hardwired voltage monitor may be provided. Stand-alone hard analog blocks may include I/O circuits.

Embedded analog peripherals may also be used to enhance generic microcontroller ("MCU") functions with a programmable "soft" processor core programmed into the programmable logic block. As will be appreciated by persons of ordinary skill in the art, the numbers and kinds of inputs and outputs of the individual analog ASIC circuit blocks 16a through 16f will depend on the functional nature of the circuits employed.

Digital ASIC circuit blocks 18a through 18f are illustrated in FIG. 1, although persons of ordinary skill in the art will observe that the provision of six digital ASIC circuit blocks 18a through 18f in FIG. 1 is merely illustrative and in no way limiting. Actual embodiments of system-on-a-chip integrated circuits according to the present invention may have an arbitrary number of digital ASIC circuit blocks. Digital ASIC circuit blocks 18a through 18f may comprise circuit blocks such as, but not limited to, state machines, analog sequencers, microprocessors, digital signal processors ("DSPs") Hard digital blocks are especially useful to implement interfaces such as the interface between the programmable logic and the memory blocks on a device. The FPGA/Memory interface is described in more detail in the section describing the non-volatile memory controller. Hard digital blocks may also be used to implement interfaces between the programmable logic or the memory blocks and hard analog blocks. A hard digital block is used as a control block for the non-volatile memory block. The non-volatile memory controller is described in more detail herein.

Such digital blocks may be implemented in a similar manner to the way in which such digital blocks are implemented in current application-specific integrated circuits ("ASICs"). In addition to being implemented as hard digital circuit blocks, all, or a portion of each of these types of blocks may be implemented in programmable logic, sometimes referred to as "soft" implementations. As will be appreciated by persons of ordinary skill in the art, the numbers and kinds of inputs and outputs of the individual digital ASIC circuit blocks 18a through 18f will depend on the functional nature of the circuits employed.

System-on-a-chip integrated circuit 10 also includes digital I/O circuit blocks 20. Digital I/O circuit blocks 20 may comprise conventional digital I/O circuitry, such as that commonly employed in known FPGA and similar integrated circuits.

System-on-a-chip integrated circuit 10 also includes analog I/O circuit blocks 22. Analog I/O circuit blocks 22 may comprise any of the many analog buffer circuits that are well known in the art.

System-on-a-chip integrated circuit 10 also includes a system controller circuit block 24. A system controller circuit block 24 provides master control functionality for the other blocks in the SOC device, including managing power up sequencing and inter-operation of the various components of the system on a chip. In addition, the system controller 24 may control off-chip devices via signals output via the digital or analog I/Os of the device of the present invention such as reset and enable signals. The system controller 24 includes various circuits for managing the different functions of the SOC device. In some embodiments, these circuits may all be implemented in hardwired circuit blocks, while in other embodiments, some of the circuits may be implemented in a portion of the programmable logic of the programmable logic block 12. An advantage of implementing control functions in programmable logic is that the user is able to adapt the control functions to the user's application. This is especially useful if the user wishes to employ the programmable system on a chip device to control elements of the user's system that are outside the system on a chip device.

In the embodiment of a system controller shown in FIG. 1, a portion of the system controller's circuits are implemented in hardwired blocks, and a portion are implemented in programmable logic. The system controller 24 shown in FIG. 1 includes a power-up control circuit, an analog power supply circuit, a voltage reference circuit, and a system supervisor circuit. The power-up control circuit includes circuitry for managing the SOC device during power-up, as will be described in more detail below.

System-on-a-chip integrated circuit 10 also includes a clock circuit 26. Clock circuit 26 may include one or more clock sources and clock-signal-distribution systems. The number of such clocks provided on any system-on-a-chip integrated circuit fabricated according to the present invention is a matter of design choice. Such circuits and systems are well known in the art.

The inputs and outputs of the various circuit elements of the programmable logic block 12, a non-volatile memory block 14, analog ASIC circuit blocks 16a through 16d, digital ASIC circuit blocks 18a through 18d, digital input/output ("I/O") circuit blocks 20 and analog I/O circuit blocks 22, system controller circuit block 24 and clock circuit 26 may be connected together by a user by programmably connecting together their various inputs and outputs through a network of programmable interconnect conductors that is provided on the system-on-a-chip integrated circuit.

Figure 2:
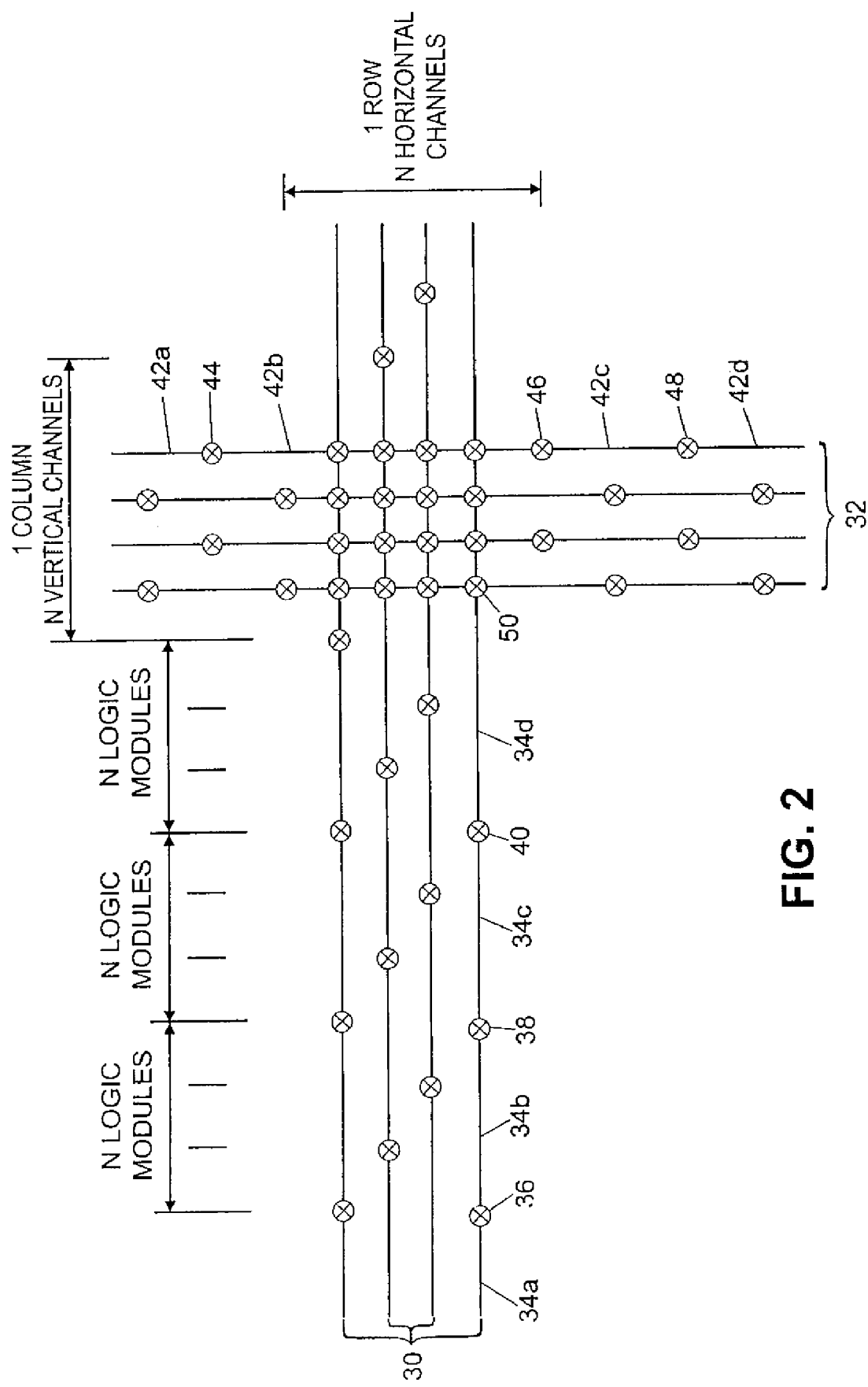
FIG. 2 is a simplified diagram of a portion of an illustrative interconnect architecture that may be used to interconnect the inputs and outputs of the various circuit elements of the system-on-a-chip of FIG. 1 to form user circuit systems.

A simplified diagram of a portion of an illustrative programmable interconnect architecture that may be employed with the system-on-a-chip integrated circuit of FIG. 1 is shown in FIG. 2. FIG. 2 illustrates a portion of an illustrative interconnect architecture. Persons of ordinary skill in the art will understand that FIG. 2 is largely schematic and simplified in nature, and in no way limits the present invention to the particular interconnect architecture depicted.

As can be seen from an examination of FIG. 2, an illustrative interconnect architecture that can be implemented with the present invention may include interconnect conductors that run in horizontal and vertical directions in metal interconnect layers disposed over the surface of the silicon die comprising the system-on-a-chip integrated circuit 10. Both the horizontal and vertical interconnect conductors may be segmented to allow versatility in forming interconnect between inputs and outputs of the various circuit elements disposed in system-on-a-chip integrated circuit 10 of FIG. 1. As is known in the art, the various interconnect conductors may be of varying lengths or may be segmented into varying lengths. In addition, either flat or hierarchical interconnect systems may be employed.

The segments of the horizontal and vertical interconnect conductors may be programmably joined together by user-programmable interconnect elements indicated by the circled "X" symbols shown on FIG. 2. Intersections formed by individual ones of the horizontal and vertical interconnect conductors may also be populated by user-programmable interconnect elements. The user-programmable interconnect elements may be in the form of one-time programmable anti-fuse elements as are known in the art, or may be in the form of reprogrammable switches as are also known in the art. The latter reprogrammable interconnect switches may employ technologies such as flash memory, SRAM, and other known interconnect switch technologies.

As shown in FIG. 2, a group 30 of segmented horizontal interconnect conductors is shown crossing a group 32 of segmented vertical interconnect conductors to form intersections. Persons of ordinary skill in the art will recognize that the horizontal interconnect conductors and the vertical interconnect conductors are disposed in different metal interconnect layers of the system-on-a-chip integrated circuit. An exemplary individual horizontal interconnect conductor is shown to be comprised of segments 34a, 34b, 34c, and 34d, each adjoining segment being coupled to one another by user-programmable interconnect elements 36, 38, and 40, as shown in FIG. 2. Similarly, an exemplary individual vertical interconnect conductor is shown to be comprised of segments 42a, 42b, 42c, and 42d, each adjoining segment being coupled to one another by user-programmable interconnect elements 44, 46, and 48, as also shown in FIG. 2.

Horizontal interconnect conductor segment 34d is shown intersecting vertical interconnect conductor segment 42b. The intersection of these two interconnect conductor segments is populated with a user-programmable interconnect element 50.

By programming appropriate ones of the user-programmable interconnect elements, a conductive path may be formed between the output of one of the circuit elements on the system-on-a-chip integrated circuit and the input of another one of the circuit elements on the system-on-a-chip integrated circuit to form a connection therebetween. Persons of ordinary skill in the art will appreciate that the illustrative interconnect architecture depicted in FIG. 2 may appear more or less regular over areas such as the FPGA array of logic block 12 of FIG. 1 and may vary in density, pattern, and/or and direction over other areas and circuit blocks of the system-on-a-chip integrated circuit 10 of FIG. 1 as appropriate for the desired connection opportunities.

Figure 3:
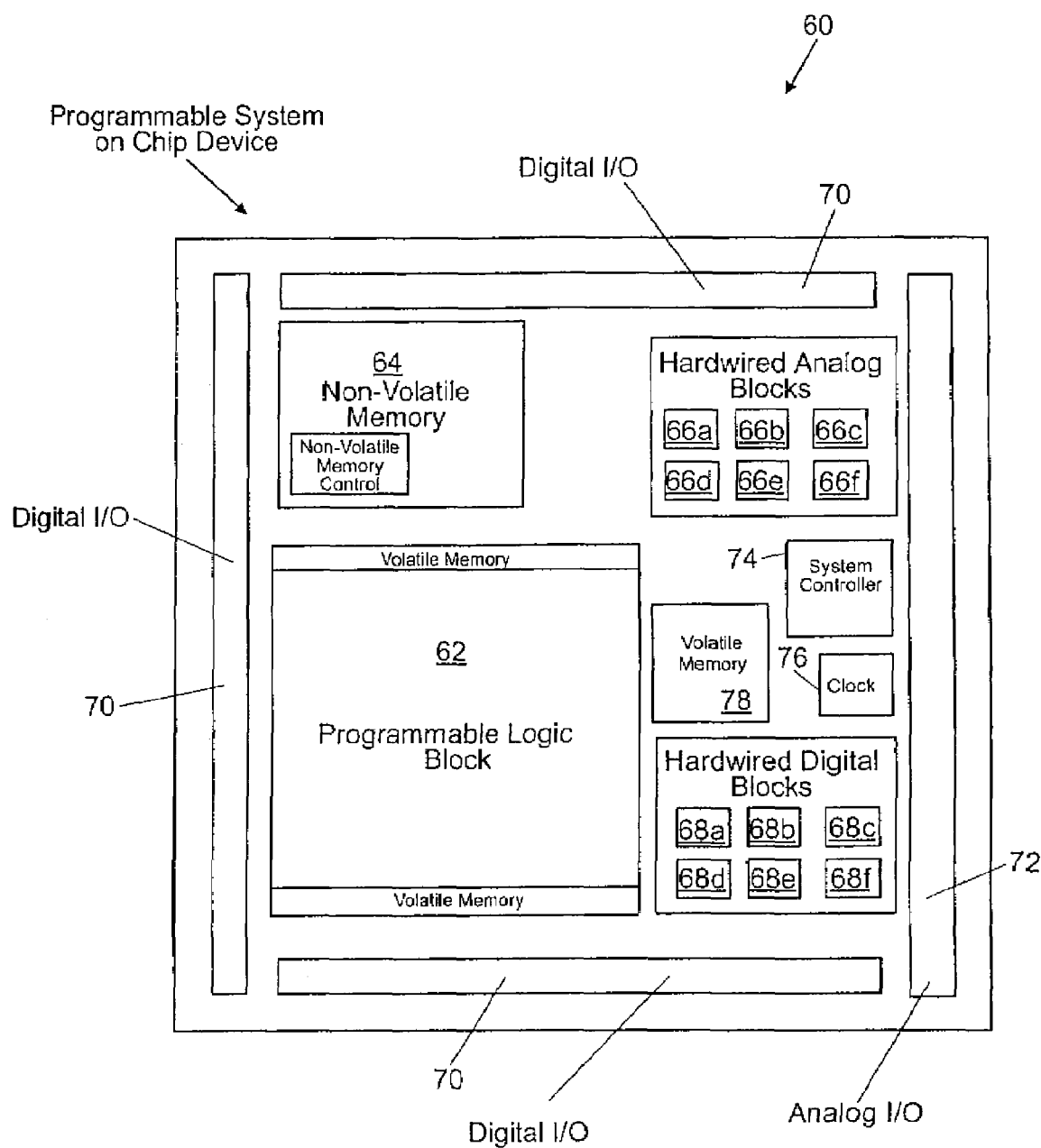
FIG. 3 is a block diagram of another illustrative embodiment of a system-on-a-chip that includes a volatile memory block such as an SRAM block.

FIG. 3 is a block diagram of a system-on-a-chip integrated circuit 60 similar to the system-on-a-chip integrated circuit 10 shown in FIG. 1, in that it includes a programmable logic block 62, a non-volatile memory block 64, analog ASIC circuit blocks 66a through 66f, digital ASIC circuit blocks 68a through 68f, digital input/output ("I/O") circuit blocks 70 and analog I/O circuit blocks 72, a system controller circuit block 74 and a clock circuit 76. System-on-a-chip integrated circuit 60 also includes a volatile memory block 78 (e.g., an SRAM block). As in the embodiment illustrated in FIG. 1, the configuration shown in FIG. 3 is simply suggestive of the feature set of a system-on-a-chip integrated circuit and is not intended to be limiting in terms of the number and distribution of circuit blocks, layout and other design-choice features.

Figure 4:
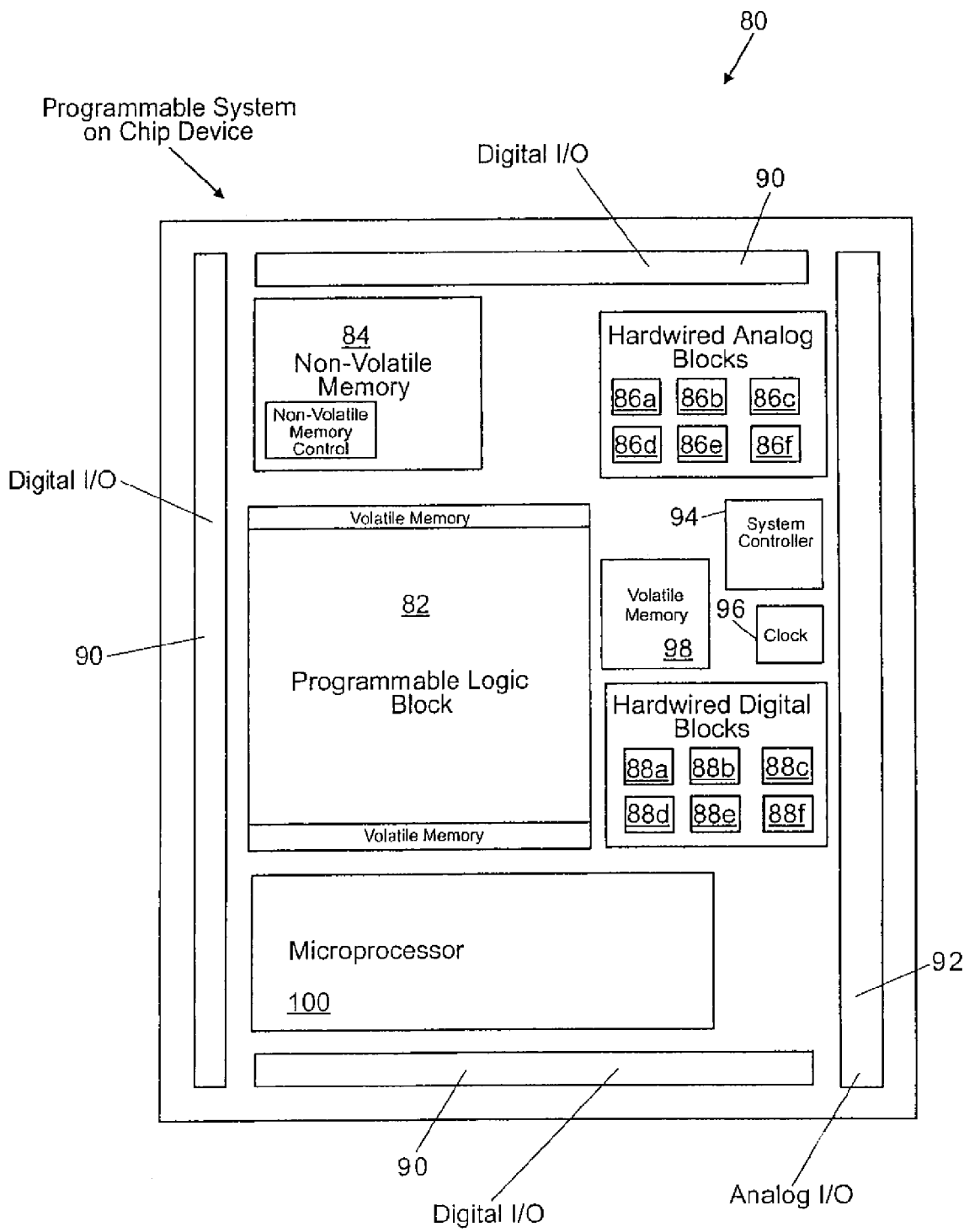
FIG. 4 is a block diagram of another illustrative embodiment of a system-on-a-chip based on use of a highly successful flash FPGA architecture, for the programmable logic block.

Another embodiment of an FPGA-based system-on-a-chip 80 is shown in FIG. 4. As in the embodiments shown in FIGS. 1 and 3, the FPGA-based system-on-a-chip shown in FIG. 4 includes a programmable logic block 82, a non-volatile memory block 84, analog ASIC circuit blocks 86a through 86f, digital ASIC circuit blocks 88a through 88f, digital input/output ("I/O") circuit blocks 90 and analog I/O circuit blocks 92, system controller circuit block 94 and a clock circuit 96. The system-on-a-chip integrated circuit 80 of FIG. 4 also includes SRAM block 98. The system-on-a-chip integrated circuit 80 of FIG. 4 also includes a microprocessor 100. In the embodiment of FIG. 4, Flash memory block 84 and SRAM block 98 are large enough to allow full use of the microprocessor. An example of such an embodiment may include a microprocessor such as an 8051 hardwired core (a popular 1970's 8-bit microprocessor with a 16-bit address space) with 64 K-bytes of SRAM and 64 K-bytes of flash memory. According to one aspect of the present invention, it will be advantageous to configure the SRAM block 98 and flash memory block 84 into separate small blocks (e.g., 1K, 2k, or 4K) and allow them to be programmed into the address space of the microprocessor 100 as desired. In such an embodiment, memory blocks that are not used by the processor could be allocated for use by the FPGA block 82 of the circuit.

According to another aspect of the present invention, a more sophisticated microprocessor or microcontroller, a system bus and other features like timers, UARTs, SRAM or DRAM ports, etc., may be provided. The SRAM may operate under DMA mode for the microprocessor. An FPGA or other programmable logic device, including a microprocessor (soft or hard) requires memory for program store. Because program-store memory never changes, an on-board PROM program-store block is useful for this task. PROM memory has an advantage as it is much denser than SRAM and does not need to be loaded from some external source. The PROM however may be quite slow, so a SRAM cache may be provided for the fast processor into which the PROM program-store is loaded (perhaps in parallel or in the background) such that the entire PROM would not need to be duplicated in SRAM. There are well known methods for a processor to download blocks of memory to the cache as they are needed.

SRAM-based FPGA is typically configured by a bit-stream that is stored in non-volatile memory, by integrating a microcontroller and flash FPGA in one chip, The microcontroller can take the control of FPGA re-configuration for certain applications during boot-up or on-the-fly system operation. On the other hand, the configuration procedure can be reversed to let the FPGA set up the microcontroller, for example, if the system times out or hangs during operation, the FPGA can send a soft reset to the microcontroller instead of requiring a hard reset. Both the microcontroller and FPGA blocks share on-chip SRAM, which can be designed as dual-port SRAM to be accessed synchronously. In order to reduce data latency, on-chip SRAM can work under DMA mode for the microcontroller. Customized instructions can be implemented in flash memory, or FPGA blocks can be reconfigured as a co-processor either through the on-chip microcontroller or external host to build a powerful flash-based FPGA on-chip processor platform.

One particular embodiment of the invention may be configured using a highly successful flash FPGA architecture as the programmable logic block 12 of FIG. 1. An example of such an architecture may be found in the ProASIC line of FPGA integrated circuits available from Actel Corporation of Mountain View, Calif. By combining an advanced flash FPGA core with embedded flash memory blocks or analog peripherals, system-on-a-chip devices according to the present invention dramatically simplify system design, and as a result, save both board space and overall system cost. The state-of-the-art flash memory technology offers very high-density integrated flash arrays and therefore a substantial cost saving over use of external flash chips to configure SRAM-based FPGAs, the traditional alternative. The multiple analog circuit blocks extend the traditional FPGA application from the purely digital domain to mixed-signal applications. The embedded flash memory and integrated analog circuit blocks can be used with an integrated soft (i.e., configured from programmable logic) processor to implement a full functional flash microcontroller unit (MCU), or the advanced analog circuit blocks can be used with high speed FPGA logic to offer system and power supervisory abilities.

Figure 5:
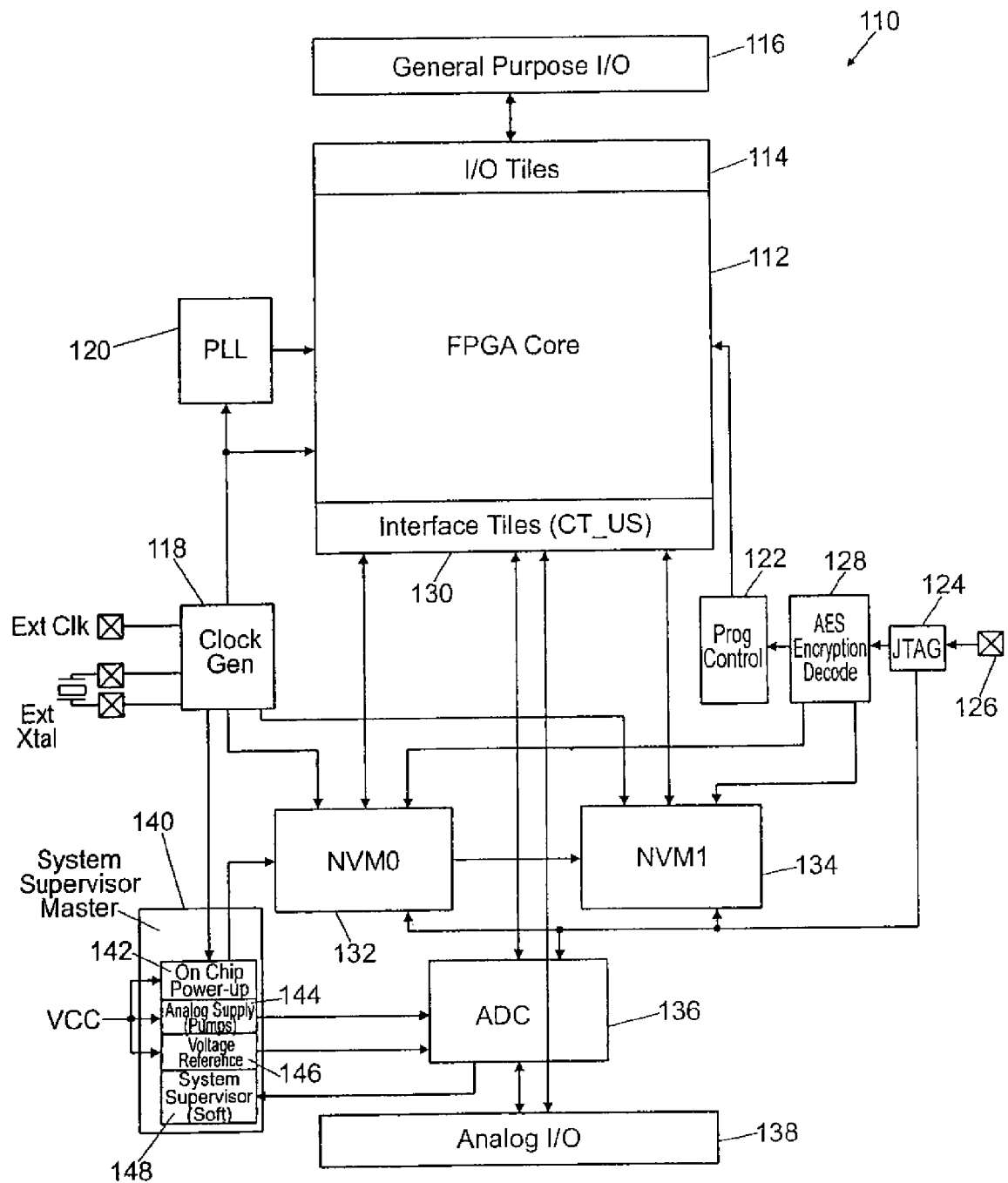
FIG. 5 is a block diagram of another illustrative embodiment of a system-on-a-chip based on use of a flash FPGA architecture for the programmable logic block.

Such an embodiment of the present invention is illustrated in the block diagram of FIG. 5. SOC 110 includes a field-programmable gate array (FPGA) that includes an FPGA core 112 comprising logic tiles, routing, and flash-cell switches and programming structures and techniques as is known in the art. General-purpose input/output (GPIO) circuits 116 may be coupled to the FPGA core 112 through I/O tiles 114 as is known in the art.

A clock generator circuits block 118 and distribution system is included to provide an on-chip source for clock signals. The clock generator circuits block 118 may include RC oscillators. One or more of these moderate precision (1-2%) clock sources may be completely contained within the SOC 110 and may be used for internal charge pumps and NVM erase/program timing. They can also be the source of clocks for the FPGA and/or the external system where precise frequency control is not needed. The clock generator circuits block 118 in SOC 110 of the present invention may also include a crystal oscillator circuit. This relatively high-precision clock source (~100 PPM) requires an inexpensive external crystal that may be connected to the SOC 110 through a pair of I/O pins as shown in FIG. 5. The clock-generator circuits block 118 can be used for all FPGA and system clock requirements. The SOC may further include one or more phase locked loops (PLLs) 120.

In addition, clock generator 118 of the SOC 110 of FIG. 5 may also include a glitchless clock multiplexer to allow clean switching between multiple internal or external clock sources. The glitchless clock multiplexer may be used to provide a selectable low power (low frequency) mode to on-chip clocked systems, or to switch between clocks for any other application reason. This can save board space in a system in which the SOC is used and provides a reliable clock source for critical system management functions. An illustrative clock multiplexer will be described with reference to FIG. 6.

A flash programming circuit 122 for programming the FPGA, is coupled to a JTAG TAP controller 124, designed in accordance with the JTAG standard, for entering the programming data through a JTAG port 126 to define the configuration of the FPGA circuits as is known in the art. A security circuit implementing an encryption/decryption algorithm may be provided. For example, decryption circuit 128 may be a circuit designed to implement the AES encryption/decryption standard. The Advanced Encryption Standard ("AES") (FIPS PUB 197) National Institute of Standards and Technology (NIST), Gaithersburg, Md., is available from National Technical Information Service (NTIS), 5285 Port Royal Road, Springfield, Va. 22161. The Advanced Encryption Standard (AES) specifies a cryptographic algorithm that can be used to protect electronic data. The AES algorithm is a symmetric block cipher that can encrypt (encipher) and decrypt (decipher) information. The AES algorithm is capable of using cryptographic keys of 128, 192, and 256 bits to encrypt and decrypt data in blocks of 128 bits. The algorithm specified in this standard may be implemented in software, firmware, hardware, or any combination thereof. The specific implementation may depend on several factors such as the application, the environment, the technology used, etc. Encryption can be used to protect the FPGA configuration information, the contents of the non-volatile memory, etc.

GPIO circuits that would normally be disposed along the lower edge of the FPGA core are shown replaced in FIG. 1 by internal interface circuits 130 for making connections between the FPGA core 112 and the other SOC circuit blocks. According to one aspect of the present invention these GPIO circuits and interface blocks may be in the form of "tiles" having identical footprints.

SOC 110 also includes at least one non-volatile memory (NVM) block. In the illustrative embodiment of the present invention shown in FIG. 5 there are two NVM blocks 132 and 134 that are stand-alone flash memory arrays. According to another aspect of the present invention, the flash memory arrays are preferably sized between about 64 kBytes to about 512 kBytes. Each of flash memory arrays 132 and 134 has built-in known charge pumps and programming circuits to allow each to operate independently from the other and from the FPGA core. The provision of more than one flash memory block permits the SOC 110 of FIG. 5 to simultaneously perform two separate system functions using non-volatile memory. In the illustrative embodiment of the invention shown in FIG. 5, timing input is provided to the flash memory blocks from the on-chip clock generator circuits 118 for accurate/reliable programming and erase of each flash memory array 132 and 134.

According to another aspect of the present invention, provision is made for several possible NVM programming paths for NVM blocks 132 and 134, including through the FPGA from data sources in the FPGA core 112, through the FPGA core from data sources outside the FPGA core 112 through the GPIO 116, directly from the JTAG port 124 from external JTAG masters (such as an FPGA programmer), and data streams decrypted by the AES block 126 from JTAG data sources. The FPGA to NVM module interface provides JTAG full capture and control boundary scan register functionality. A boundary scan register can directly control and capture all core to NVM inputs and can capture all NVM outputs in a manner known in the boundary-scan art.

According to another aspect of the present invention, the NVM blocks 132 and 134 can be used to store data appropriate to provide power-up initialization of FPGA memories, analog-to-digital converter (ADC) functions, system-wide power up functions, program storage for microcontrollers or microprocessors, and general data storage as is known in the art.

The SOC 110 of FIG. 5 also includes an ADC 136. According to one illustrative embodiment of the invention, the ADC may select from one of a plurality of multiplexed analog inputs and converts the applied voltage to an equivalent digital value. The ADC may also include selectable conversion resolution (e.g., 8, 10, or 12 bit conversion). According to one illustrative embodiment of the invention, a voltage reference input at the input of ADC 136 corresponds to full-scale output. As will be further disclosed herein, ADC 136 may include a multiplexer coupled to its input to allow multiple analog voltage sources to be used. The ADC 136 is coupled to analog I/O 138. Analog I/O 138 is also coupled to interface tiles 130 as will be more fully disclosed herein.

The SOC 110 of FIG. 5 also includes a system supervisor master block 140. System supervisor master block 140 includes an on-chip power up block 142, analog voltage supply charge pumps 144, an on-chip voltage reference 146 and a system supervisor block 148.

Figure 6:
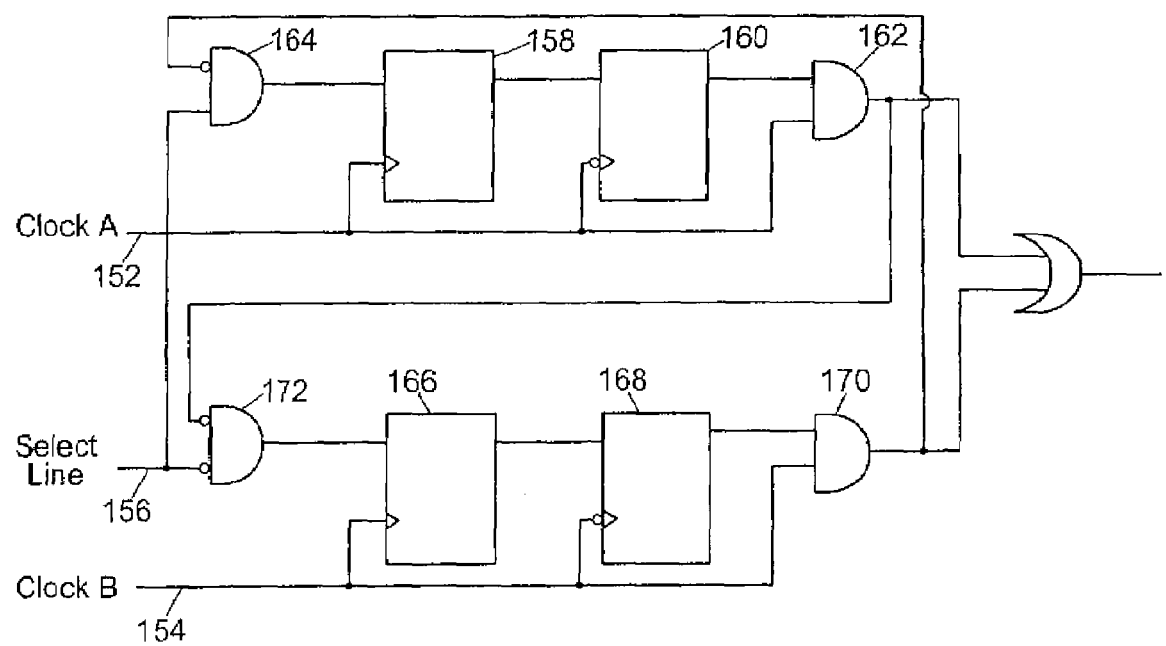
FIG. 6 is a schematic diagram of an illustrative glitchless clock multiplexer that is suitable for use in the SOC of the present invention.

Referring now to FIG. 6, an illustrative glitchless clock multiplexer 150 that is suitable for use in the SOC of the present invention is shown. Glitchless clock multiplexer 150 may be used to select between a "Clock A" input at line 152 and a "Clock B" input at line 154 by use of a select line 156. The clock A input 152 drives the clock inputs of data latches 158 and 160 and one input of AND gate 162. Select line 156 is coupled to one input of an AND gate 164 whose output drives the data input of data latch 158.

Similarly, the clock B input 154 drives the clock inputs of data latches 166 and 168 and one input of AND gate 170. The data output of data latch 168 drives the other input of AND gate 170. Select line 156 is coupled to one (inverted) input of an AND gate 172 whose output drives the data input of data latch 166. The output of AND gate 170 drives the other (inverted) input of AND gate 164 and the output of AND gate 162 drives the other (inverted) input of AND gate 172. The outputs of AND gates 162 and 170 drive inputs of OR gate 174. Persons of ordinary skill in the art will observe that the circuit of FIG. 6 allows selecting between the clock inputs A and B without producing any glitches at the output of OR gate 174.

As previously mentioned, analog I/O circuits 138 in FIG. 5 are used to provide inputs and outputs to ADC 136. According to one illustrative embodiment of the present invention, shown in FIG. 7, analog I/O functions may be grouped into sets. Analog I/O circuits 138 may contain a number of these sets.

Figure 7:
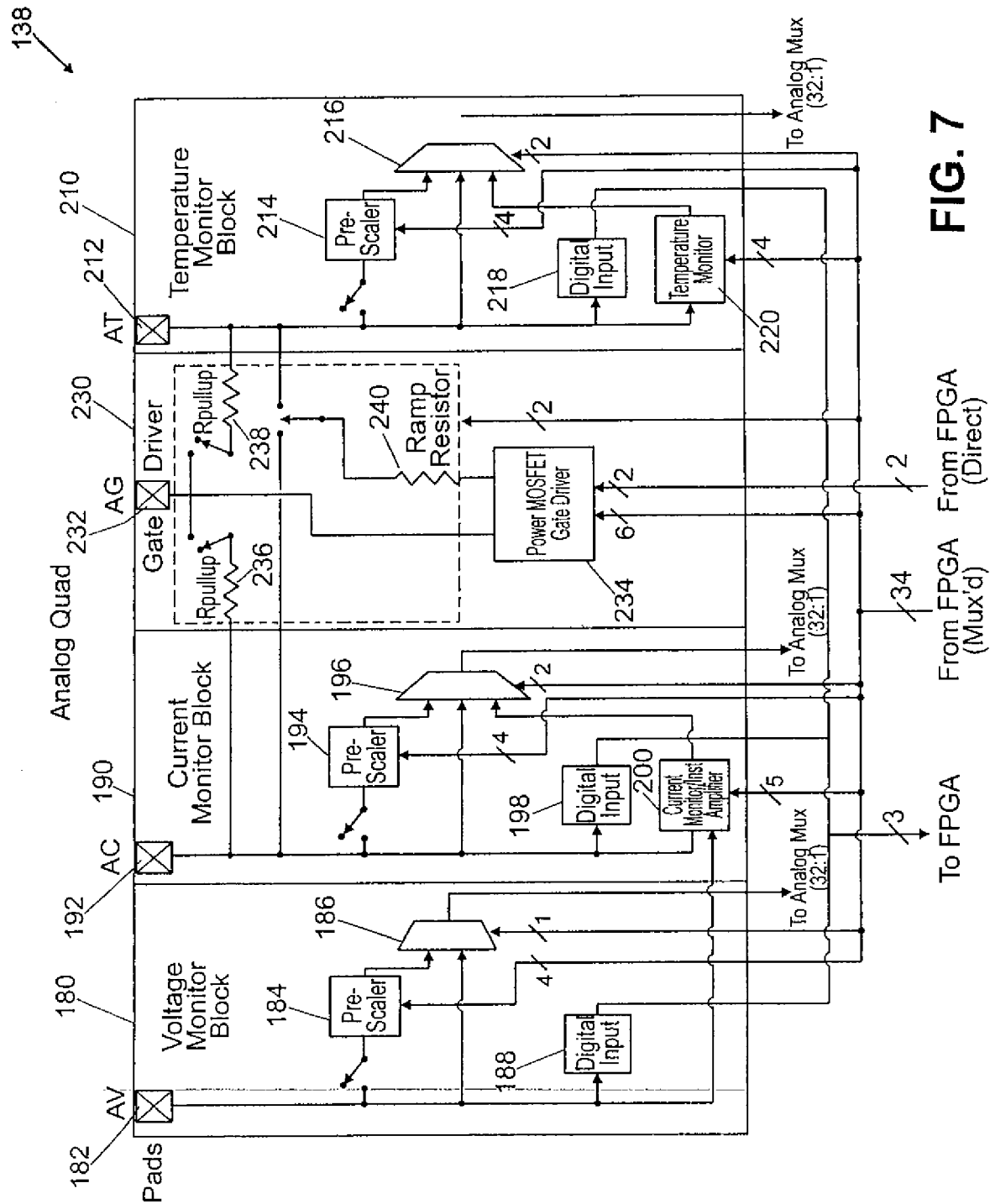
FIG. 7 is a block diagram of a portion of the SOC of FIG. 5 showing analog I/O function circuits grouped into sets according to one illustrative embodiment of the present invention.

The set of analog I/O circuits shown in FIG. 7 has four members. Persons of ordinary skill in the art will realize that FIG. 7 is illustrative only, and a set of analog I/O circuits in an actual SOC may have fewer or more members. In the embodiment illustrated in FIG. 7, a first member 180 of the set may be a voltage input block coupled to I/O pad 182. I/O pad 182 that may either have a direct connection to the input of ADC 136 (or one input of its input multiplexer), or may be connected to it through a buffered prescaler circuit 184. Prescaler circuit 184 may have a programmable gain set to 1 of n selectable values as will be disclosed further herein. Multiplexer 186 is employed to select between the direct input or the prescaled input. The select inputs of multiplexer 186 may be controlled from the FPGA. According to another aspect of the SOC of the present invention, I/O pad 182 can be configured through digital input circuit 188 as a low-performance digital input to the FPGA core.

A second member 190 of the set may be a current-monitor input block coupled to I/O pad 192. Like I/O pad 182, I/O pad 192 may either have a direct connection to the input of ADC 136 (or one input of its input multiplexer), or may be connected to it through a buffered prescaler 194. Like prescaler 184, prescaler 194 may have a programmable gain set to 1 of n selectable values as will be disclosed further herein. Multiplexer 196 is employed to select between the direct input from I/O pad 192 or the prescaled input. The select inputs of multiplexer 196 may be controlled from the FPGA. Like I/O pad 182, I/O pad 192 can be configured through digital input circuit 198 as a low-performance digital input to the FPGA core.

Figure 9:
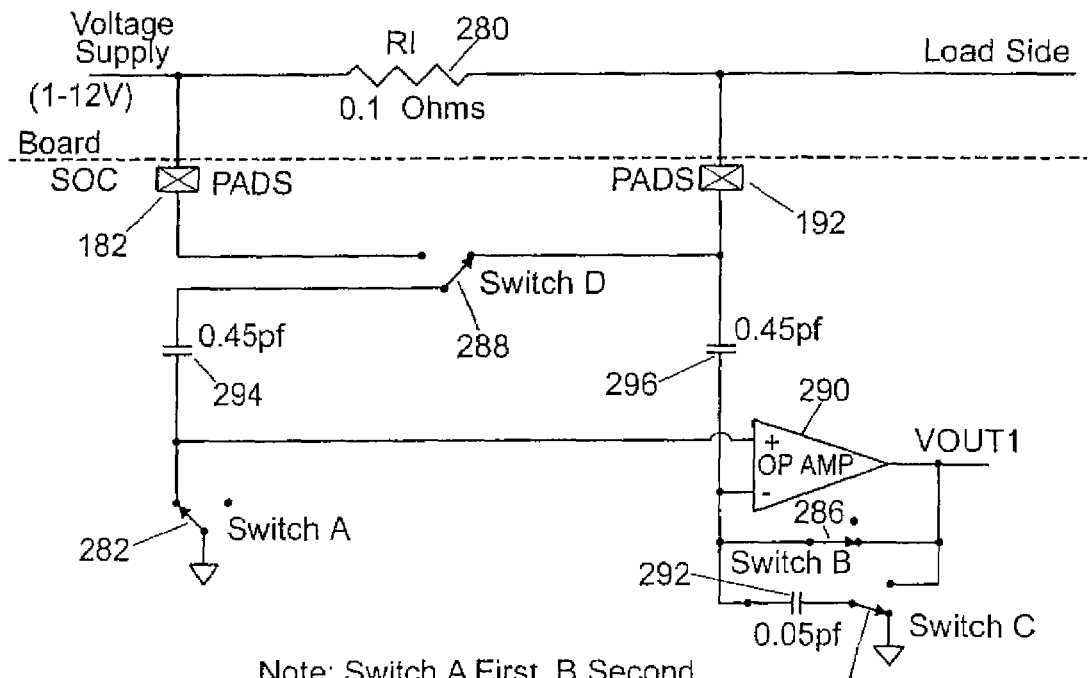
FIG. 9 is a diagram of an illustrative configuration for the amplifier of FIG. 7.

In addition to the functions that are identical to that for I/O pad 182, set member 190 may be used to measure the difference between I/O pad 182 and 192. This may be used to measure a voltage drop across a small resistor in series with an external power supply. I/O pad 192 is connected to one input of an amplifier 160. The other input of amplifier 198 is coupled to I/O pad 182. The output of amplifier 160 is presented to a third input of multiplexer 194. If a low value (e.g., 0.1 ohms) resistor (not shown in FIG. 7) is coupled between I/O pads 182 and 192, and a voltage supply potential is coupled to I/O pad 182 and a load is coupled to I/O pad 192, the voltage drop across that resistor can be sensed and amplified by amplifier 200. That voltage drop is directly proportional to the current flowing through the resistor. An illustrative configuration for amplifier 160 is shown and described with reference to FIG. 9.

A third member 210 of the set may be a temperature-monitor input block coupled to I/O pad 212. Like I/O pad 182, I/O pad 212 may either have a direct connection to the input of ADC 136 (or one input of its input multiplexer), or may be connected to it through a buffered prescaler 214. Like prescaler 184, prescaler 214 may have a programmable gain set to 1 of n selectable values as will be disclosed further herein. Multiplexer 216 is employed to select between the direct input from I/O pad 210 or the prescaled input. The select inputs of multiplexer 216 may be controlled from the FPGA. Like I/O pad 182, I/O pad 212 can be configured through digital input circuit 218 as a low-performance digital input to the FPGA core.

In addition to the functions that are identical to that for I/O pad 182, set member 210 may be used as a temperature monitor for a signal on I/O pad 212. This set member 210 may be configured to measure temperature of an external diode by taking advantage of the temperature behavior of the I-V characteristics of a diode. A temperature monitor circuit 220 may also be coupled to an input of multiplexer 216. The SOC of the present invention may be supplied with a plurality of temperature monitor circuits. According to one embodiment of the invention, a number of temperature sensors are for measuring external temperature (e.g., the junction temperatures of other ICs or air temperature) and one for measuring its own junction temperature. Temperature monitor circuit 220 is explained in more detail with reference to FIG. 10.

A fourth member 230 of the set may be a gate-driver output block coupled to I/O pad 232. Power MOSFET gate driver circuit 234 drives I/O pad 232 from the FPGA. I/O pad 232 may be coupled to I/O pad 232 and/or I/O pad 212 through either of pullup resistors 236 and 238, respectively. Persons of ordinary skill ion the art will realize that resistors 236 and 238 are optional. An optional ramp resistor 200 may be coupled to I/O pad 232 or I/O pad 212. Gate driver circuit 234 is explained in more detail with reference to FIG. 11.

Figure 8:
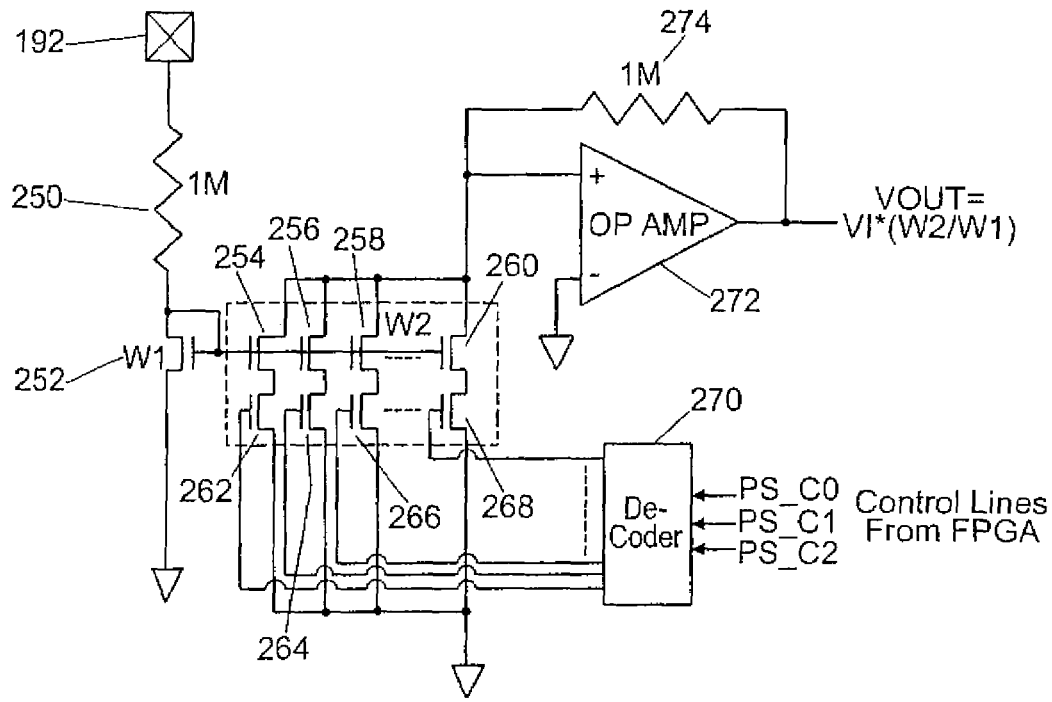
FIG. 8 is a diagram of a pre-scaler circuit that can scale external voltages by one of eight factors.

According to one embodiment of the present invention, the pre-scaler circuits 184, 194, and 214 are provided to scale external voltages up or down. Referring now to FIG. 8, a pre-scaler circuit is shown that can scale external voltages by one of eight factors. The pre-scaler circuit can be used in voltage monitor functions or in any analog input functions. The pre-scaler circuit may be based upon a current mirror circuit. A first side of the current mirror circuit including a resistor 250 coupled between I/O pad 192 and diode-connected n-channel MOS transistor 252. The gate and drain of diode-connected n-channel MOS transistor 252 are connected to the gates of n-channel MOS transistors 254, 256, 258, and 260. The ratios of the width of diode-connected n-channel MOS transistor 252 to the widths of n-channel MOS transistors 254, 256, 258, and 260 are selected to produce the desired scaling factors.

The sources of n-channel MOS transistors 254, 256, 258, and 260 are coupled to a fixed potential, such as ground, through enable n-channel transistors 262, 264, 266, and 268, respectively. The gates of enable n-channel transistors 262, 264, 266, and 268 are driven from a decoder circuit 310. The control lines of decoder circuit 310 are driven from the FPGA array. The drains of n-channel MOS transistors 254, 256, 258, and 260 are coupled together to the non-inverting input of operational amplifier 312. Resistor 314 sets the gain of operational amplifier 312.

According to one aspect of the invention, the following voltage-scaling factors: 0.20161, 0.40322, 0.80645, 1.6129, 3.2258, 6.45161, 12.90322, and 25.80645 have been found to be particularly useful. This is particularly useful where the full-scale voltage of ADC 136 of FIG. 5 is 3.3V. The choice of these eight scaling factors is controlled by three binary control signals coming from the FPGA. Using these factors 16V can be scaled down to 3.3V using the factor 0.20161 (16 *0.20161=3.3) and 125 mv can be scaled up to 3.3V using the factor 25.80645 (0.125 * 25.80645=3.3). Also the pre-scaler can scale negative voltages to positive voltages (i.e. −16V can be converted to 3.3V). Hence the function of the pre-scaler is to convert input voltages into ranges that are acceptable by the ADC. The reason for employing the exemplary scaling factors recited herein is for user convenience to achieve correspondence between the digital output of the ADC and one-millivolt steps. From an examination of this disclosure, persons of ordinary skill in the art will appreciate that any number of different scaling factors may be selected.

An illustrative configuration for amplifier 200 of FIG. 7 is shown and described with reference to FIG. 8. External resistor 280 is shown coupled between I/O pads 142 and 192. By the initial positions of switches 282, 284, 286, and 288 (shown in FIG. 8), the offset value of the operational amplifier 290 is stored in capacitor 292 so that the output of the operational amplifier 250 is approximately at ground. Also the capacitors 294 and 296 are charged to the voltage level which is at the right side of the external resistor 280 and the non-inverting input of the operational amplifier 290 is at ground. The inverting input of operational amplifier 290 is at virtual ground. Switches 282, 284, 286, and 288 are then switched in order (first switch 282, then switch 284, then switch 286, then switch 288). After all the switches 282, 284, 286, and 288 are at their new positions, the voltage drop across the external resistor 280 is amplified by the operational amplifier 290 with a gain defined by $(C_{256}+C_{258})/C_{258}$. The output voltage of the operational amplifier 290 is applied to the input of the ADC. Since the value of the external resistor value is known, the current through the external resistor is known. The configuration of the circuit of FIG. 9 has the advantage of avoiding amplifying the voltage offset of operational amplifier 290.

Figure 10:
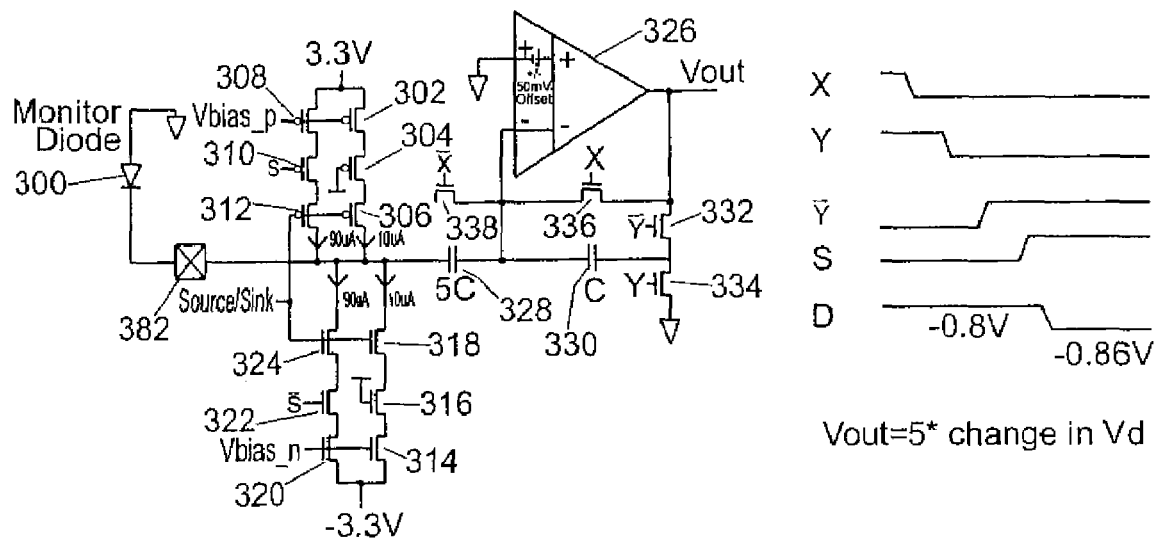
FIG. 10 is a diagram of an illustrative temperature monitor circuit that may be usefully employed in the analog I/O function circuit of FIG. 7.

Referring now to FIG. 10, temperature monitor circuit 220 is explained in more detail. This circuit forces two different currents through a diode and measures the voltage drop difference across the diode. It then amplifies this voltage by a factor of five and sends it to the ADC. This amplified voltage difference directly corresponds to temperature (in ° K.).

For example, as shown in FIG. 10, a voltage difference of 59.6 mV (corresponding to diode temperature of 25° C.) is measured by sequentially forcing 10 uA and 100 uA across diode 300. This is amplified 5×—which gives 298 mV—which corresponds to 298K (25 C). Diode is coupled to I/O pad 212. Two current-generating circuits are shown, allowing the diode 300 to be oriented in either direction. The first current-generating circuit which sources current includes a first leg including p-channel MOS transistors 302, 304, and 306 coupled in series between a supply potential of +3.3 VDC and the I/O pad 212. The gate of transistor 302 is coupled to a positive bias potential. The gate of transistor 304 is coupled to ground and the gate of transistor 306 is coupled to a Source/Sink control signal. The sizes of transistors 302, 304, and 306 and the value of the positive bias potential are chosen to cause 10 μA to flow (source) through diode 300.

The second leg in the first current-generating circuit includes p-channel MOS transistors 308, 310, and 312 coupled in series between the supply potential of +3.3 VDC and the I/O pad 212. The gate of transistor 308 is coupled to the positive bias potential. The gate of transistor 310 is coupled to a control signal "S" and the gate of transistor 312 is coupled to the Source/Sink control signal. The sizes of transistors 308, 310, and 312 and the value of the positive bias potential are chosen to cause an additional 90 μA to flow (source) through diode 300.

Similarly, The second current-generating circuit which sinks current includes a first leg including n-channel MOS transistors 314, 316, and 318 coupled in series between a supply potential of −3.3 VDC and the I/O pad 212. The gate of transistor 314 is coupled to a negative bias potential. The gate of transistor 316 is coupled to a positive voltage and the gate of transistor 318 is coupled to the Source/Sink control signal. The sizes of transistors 314, 316, and 318 and the value of the negative bias potential are chosen to cause 10 μA to flow (sink) through diode 300.

The second leg in the first current-generating circuit includes n-channel MOS transistors 280, 282, and 284 coupled in series between the supply potential of −3.3 VDC and the I/O pad 212. The gate of transistor 280 is coupled to the negative bias potential. The gate of transistor 282 is coupled to the control signal "S" and the gate of transistor 284 is coupled to the Source/Sink control signal. The sizes of transistors 280, 282, and 284 and the value of the negative bias potential are chosen to cause 90 μA to flow (sink) through diode 300.

If the Source/Sink control signal is low, the current sourcing transistors operate. If the Source/Sink control signal is high, the current sinking transistors operate. In either case, the first leg of the circuit (either transistors 302, 304, and 306 or transistors 314, 316, and 318) are turned on, sourcing or sinking 10 μA through diode 300. When the "S" (or "S!") signal is asserted, the second leg of the circuit (either transistors 308, 310, and 312 or transistors 320, 322, and 324) is also turned on, sourcing or sinking a total of 100 μA through diode 300.

The remaining components of the circuit include operational amplifier 326 having its non-inverting input grounded, capacitor 328 coupled between I/O pad 212 and the inverting input of operational amplifier 326, and capacitor 330, coupled between the inverting input of operational amplifier 326 and its output through n-channel MOS transistor 332. In the example of FIG. 10, capacitor 328 has five times the capacitance of capacitor 330, which determines the gain of the circuit. Capacitor 330 stores and thus cancels the offset of operational amplifier 326.

The common connection of capacitor 330 and transistor 332 is coupled to ground through n-channel MOS transistor 334. The gate of transistor 332 is coupled to a control signal Y! and the gate of transistor 334 is connected to a control signal Y. An n-channel MOS transistor 336 is coupled between the inverting input sand the output of operational amplifier 326 and has its gate coupled to a control signal X. An n-channel MOS transistor 338 is coupled to the inverting input of operational amplifier 326 and has its gate coupled to a control signal X!. The relative timing of the control signals X, Y, Y! and S is shown at the right side of FIG. 10. The difference in diode voltage before and after the timing sequence is amplified by the circuit gain and appears at the output of the operational amplifier 326, corresponding to the absolute temperature.

Persons of ordinary skill in the art will appreciate that the actual current source and sink levels, supply voltage values circuit gains can be changed without changing the nature of the circuit operation. In addition, such skilled persons will realize that, while a single-ended circuit is shown in FIG. 10, a differential circuit could be used to measure the voltage across the diode.

Figure 11:
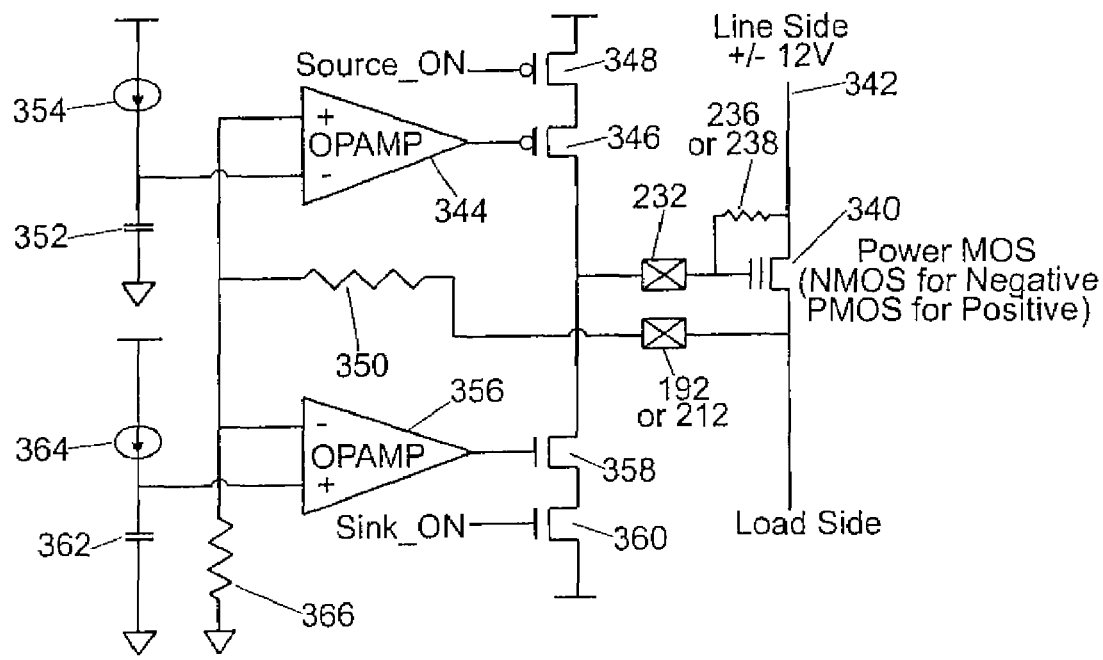
FIG. 11 is a diagram of an illustrative gate drive circuit that may be usefully employed in the analog I/O function circuit of FIG. 7.

Referring now to FIG. 11, the operation of gate driver circuit 234 of FIG. 7 is explained in more detail. External power MOSFET 340 has its source coupled to supply potential 342. Its gate is coupled to I/O pad 232 and its drain is coupled to I/O pad 212 or 192 (see FIG. 7). If supply potential 342 is positive, power MOSFET 340 will be a p-channel device and if supply potential 342 is negative, power MOSFET 340 will be an n-channel device. Resistor 236 or 238 (again see FIG. 7) may be disposed in the SOC device and is used to assure that the power MOSFET 340 will be turned off unless a gate drive signal is supplied at I/O pad 232.

Operational amplifier 344 drives the gate of p-channel MOS gate-drive transistor 346. The drain of p-channel MOS gate-drive transistor 346 is coupled to I/O pad 232. The source of p-channel MOS transistor gate-drive 346 is coupled to a positive supply potential through p-channel MOS enable transistor 348. The non-inverting input of operational amplifier 344 is coupled to the drain of power MOSFET 340 via I/O pad 192 (or 212) through resistor 350. The inverting input of operational amplifier 348 is coupled to capacitor 352 driven by constant-current source 354.

Similarly, operational amplifier 356 drives the gate of n-channel MOS gate-drive transistor 358. The drain of n-channel MOS gate-drive transistor 358 is coupled to I/O pad 232. The source of n-channel MOS transistor gate-drive 358 is coupled to a negative supply potential through n-channel MOS enable transistor 360. The inverting input of operational amplifier 356 is coupled to the drain of power MOSFET 340 via I/O pad 192 (or 212) through resistor 340. The non-inverting input of operational amplifier 356 is coupled to capacitor 362 driven by constant-current source 364. The non-inverting input of operational amplifier 344 and the inverting input of operational amplifier 356 are coupled to ground through resistor 366.

In the example shown in FIG. 11 where an n-channel MOS power transistor 340 is to be driven, p-channel enable transistor 348 is turned on. To turn on n-channel MOS power transistor 340, current source 354 is turned on and charges capacitor 352 at a linear rate. The voltage on capacitor 352 is amplified with a negative gain, producing a decreasing ramp voltage at the output of operational amplifier 348. This causes a decreasing ramp voltage at the drain of p-channel gate drive transistor 346 to turn on p-channel MOS power transistor 340. The final gate voltage on the MOS power transistor 340 is established by the IR drop across the gate-to-source resistor 236 or 238 and is determined by the current through the p-channel enable transistor 348. If it is desired to turn on a p-channel MOS power transistor, n-channel enable transistor 360 is turned on, current source 364 is turned on and charges capacitor 362 at a linear rate. The voltage on capacitor 362 is amplified with a positive gain, producing an increasing ramp voltage at the output of operational amplifier 356. This causes an increasing ramp voltage at the drain of n-channel gate drive transistor 358 to turn on the p-channel MOS power transistor. The feedback provided to the operational amplifiers 344 and 356 through resistor 350 assures controlled ramp rates on the load.

Figure 12:
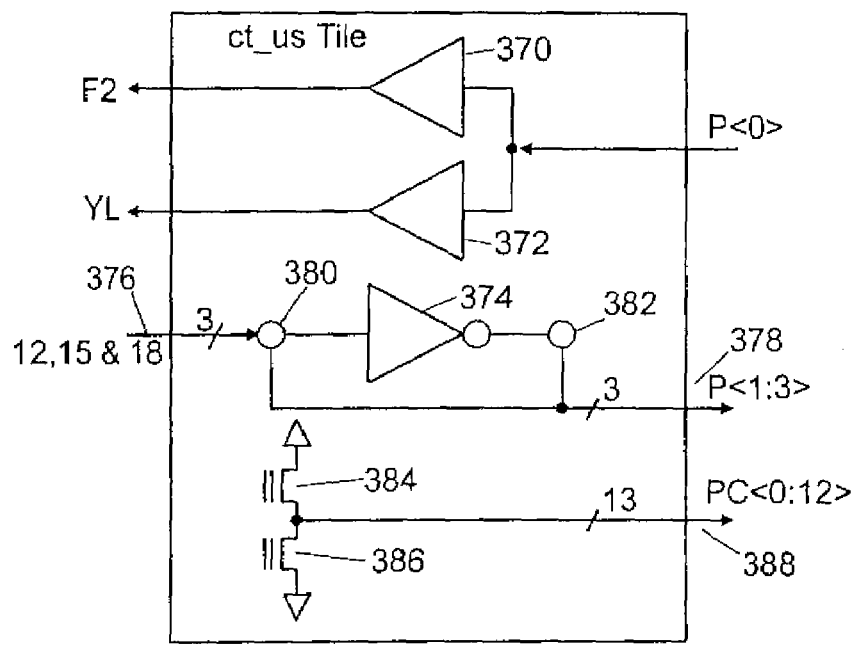
FIG. 12 is a diagram of an illustrative embodiment of internal interface circuits from FIG. 5 that are particularly useful for the SOC of the present invention.

Referring now to FIG. 12, illustrative embodiments of internal interface circuits 130 (FIG. 5) that are particularly useful for the SOC of the present invention are shown. Persons of ordinary skill in the art will observe that the circuits shown in FIG. 12 are illustrative only and not limiting. Such skilled persons will appreciate that other interface circuits may be used.

Internal interface circuit 130 (FIG. 5) may include a plurality of "tiles", each having a plurality of different types of interface circuits. For the purposes of this disclosure, a "tile" is a layout subunit where the inputs and outputs are placed in the same physical locations to allow for modular chip design. More than one of each type of circuit may be included in each tile, the exact number of each being a matter of design choice.

For example, a pair of buffers 370 and 372 may be provided. Buffers 370 and 372 are shown in FIG. 12 having their inputs coupled together and having their outputs independently connectable. Buffers 370 and 372 act as input buffers for the FPGA core.

Internal interface circuit 130 may also include inverting buffer 374 disposed between an input node 376 and an output node 378. A first programmable element 380 is coupled between the input of buffer 374 and the output node 378. A second programmable element 382 is coupled between the output of buffer 374 and the output node 378. To bypass buffer 374, programmable element 380 is programmed and programmable element 382 is left unprogrammed, connecting input node 376 directly to output node 378. To place the buffer 374 in the circuit, programmable element 382 is programmed and programmable element 380 is left unprogrammed, coupling input node 376 to output node 378 through buffer 374. Buffer 374 acts as an output buffer for the FPGA core.

In addition, a pair of programmable elements 384 and 386 may be connected in series between a logic-high voltage potential and a logic-low voltage potential. The common connection between these programmable elements is used as an output node 388 to drive, for example, the gate of transistor 348 or 360 in FIG. 11, or at least one of the control lines of multiplexers 186 196 216 of FIG. 7.

According to an illustrative embodiment of the invention, power for the analog portion of the ADC 136 may be 3.3V. The analog I/O circuits may also employ a +/−3.3V supply. These supply voltages may be generated on chip from the 1.5V $V_{CC}$ power supply using charge pump circuits in a manner known in the art. Alternatively, 3.3 volts may be supplied to the SOC and 1.5 volts may be generated on chip by regulating down from the 3.3 volts.

Figure 13:
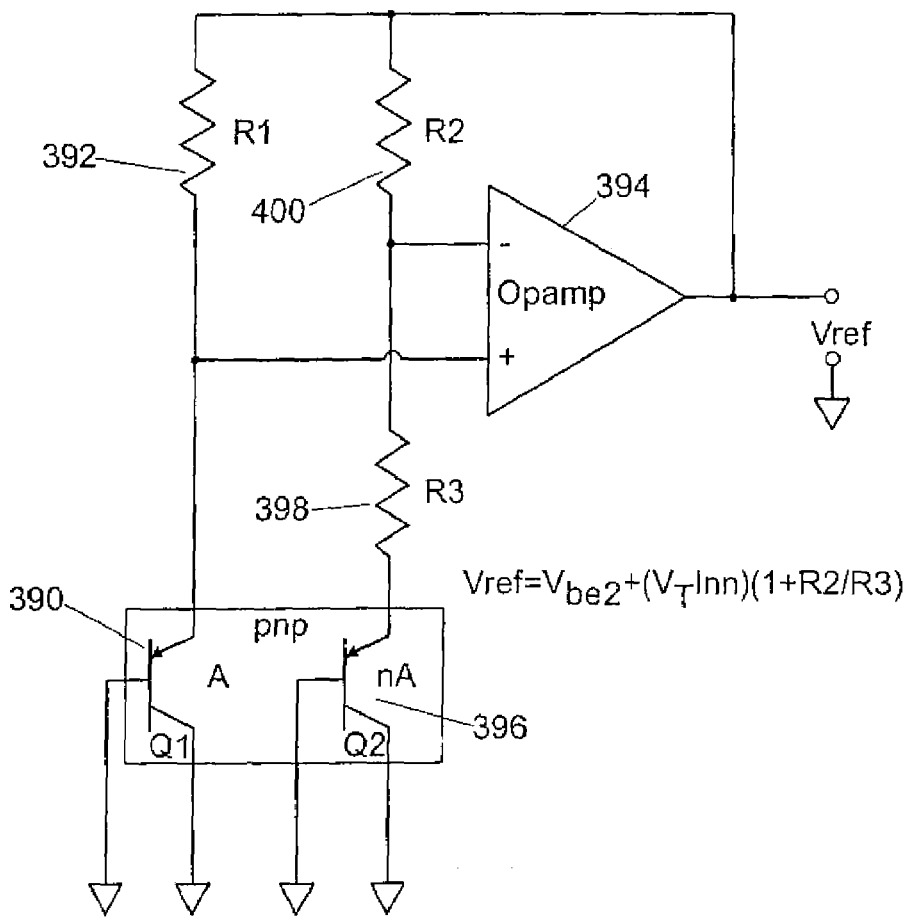
FIG. 13 is a schematic diagram of an illustrative bandgap reference that may be used in the SOC of the present invention.

A high-precision voltage is needed as a reference voltage input to the ADC 136 or may be generated within the ADC 136. This voltage may be scaled from an on chip Bandgap voltage source using known techniques. Such a bandgap reference is shown in FIG. 13. A first grounded-base PNP transistor 390 has a resistor 392 coupled between its emitter and the output of operational amplifier 394. A second grounded base pnp transistor 396 has a pair of resistors 398 and 400 coupled between its emitter and the output of operational amplifier 394. The emitter of transistor 390 is coupled to the non-inverting input of operational amplifier 394 and the common connection of resistors 398 and 400 is coupled to the inverting input of operational amplifier 394. The output voltage $V_{ref}$ of the operational amplifier 394 is given by the expression shown in FIG. 13.

A separate power source for the bandgap reference is useful for reducing the risk of coupling noise from FPGA sources. The output of the bandgap reference may also be used for controlling the level of on-chip generated analog supplies. The output of the bandgap reference may be supplied to the non-volatile memory (NVM) blocks if the particular NVM being used requires a stable reference voltage (e.g., for the sense amplifiers). The bandgap reference circuit is used to generate a reference voltage that will be used by other analog blocks as well as the ADC 136 of FIG. 5. The operational amplifier 394 is not necessarily but advantageously powered by a 3.3V charge pump. Although the $V_{ref}$ output of the circuit is voltage-, process-, and temperature-independent, the minimum voltage supply required by the operational amplifier is about 1.35V. Hence it is preferably supplied by a 3.3V charge pump and not by 1.5V $V_{CC}$.

Figure 14:
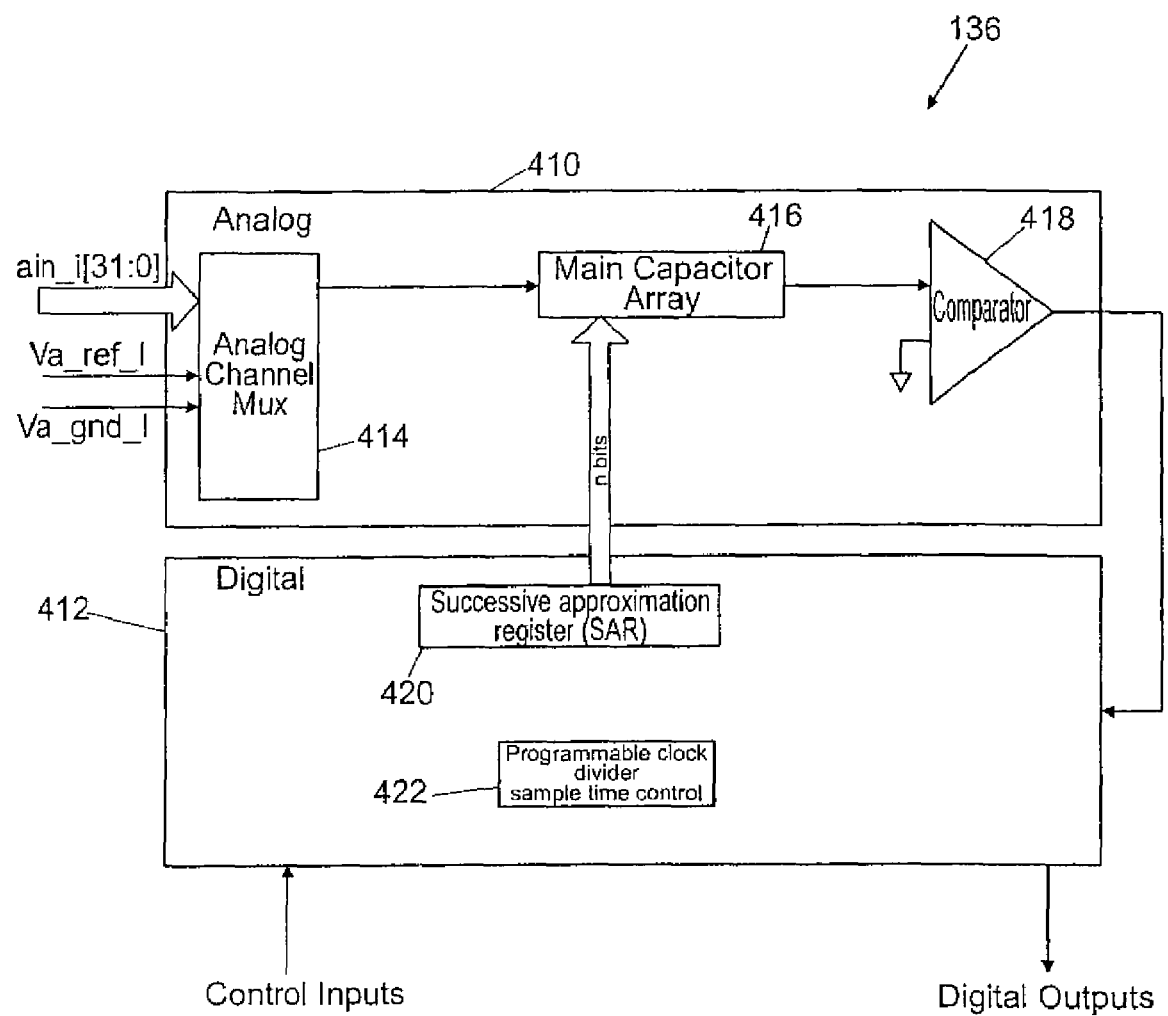
FIG. 14 is a more detailed diagram of the analog-to-digital converter shown in FIG. 5.

Referring now to FIG. 14, ADC 136 of FIG. 5 is shown in more detail. ADC 136 may be a capacitor-based successive approximation (SAR) ADC as is known in the art. The ADC 136 is divided into two portions, an analog portion 410 and a digital portion 412. The analog portion 410 contains an analog multiplexer 414, capacitor array 416 and a comparator 418. The digital part contains successive approximation register 420, clock divider 422, and conversion control logic 424. Also, as is known in the art, calibration logic 426 is coupled to a calibration capacitor array 428.

In the illustrative example shown in FIG. 14, the analog multiplexer 414 chooses one out of 32 input channels. Once a channel is selected using the multiplexer select lines, it charges the main capacitor array 416 during the sample phase. After that the sampled input that charged the capacitor array is compared to a known voltage and based on the compare result the capacitors are switched according to the successive approximation algorithm. When the two inputs of comparator 418 are equal, the data in the successive approximation register 420 is the digital equivalent of the analog input. Clock divider and sample time (which are programmable) determine the speed of this conversion.

Referring again to FIG. 5, system supervisor master 140 is intended to provide all chip-level and system level power-on/initialization/reset functions. The power-up control circuit includes circuitry for managing the SOC device during power-up, as will be described in more detail below.

The analog power supply circuitry may include known power supply and management circuits, for supplying the required voltages for operation of the various circuit blocks of the SOC device, as well as different voltages for programming the programmable elements of the SOC device. In the embodiment shown in FIG. 5, the programmable logic block and digital hardwired blocks have their own power supply circuits separate from the system controller circuit block. In this embodiment, the system controller circuit does include an analog power supply circuit block 144. The analog power supply circuit block 144 supplies power to the analog blocks as well as performing power monitoring functions for monitoring the power input to all blocks on the SOC device. The analog power supply circuitry includes voltage monitoring circuits, charge pumps, and voltage supply circuitry. These types of circuits are all known in the art and are used on other types of semiconductor devices, such as ASICs.

The analog power supply circuitry 144 includes a voltage conversion and supply circuit block that may include, for example, voltage reference circuits, charge pumps, switching supplies, switch regulators, buck/boost regulators, and voltage regulators. Use of such circuits is known by those skilled in the art. Different circuit blocks in the SOC device may require different voltages, and these voltages may be different from the voltage supplied by the system of which the SOC device is a part. The voltage conversion and supply circuitry may be implemented, therefore, to provide the required power to the various components, as is known in the art. Once the voltage input to the device has been stepped up or stepped down, if required, via the circuits discussed above, the required voltages are provided to the various components of the SOC device via hardwired power lines.

In the illustrative example of this disclosure, the voltage input to the device may be 3.3V, but the hardwired analog circuit blocks may require 1.5V so the voltage conversion and supply circuitry steps the device input voltage ($V_{CC}$) down to 1.5V in order to supply the digital circuits with the proper voltage. In the alternative 1.5 volts could be supplied to the SOC and pumped up to 3.3 volts. In the embodiment shown in the figure, other elements of the SOC, such as the programmable logic block and the non-volatile memory block have separate voltage conversion and supply circuitry that is not included in the system controller circuit block.

The analog power supply circuitry 144 also includes a voltage monitoring circuit for comparing an input voltage to a reference voltage, as is known in the art. The voltage monitoring circuit receives a voltage reference signal (e.g., a bandgap reference signal from a voltage reference circuit, described below) as an input and uses it to compare other voltage supplies (e.g., the programmable logic block voltage supply, the non-volatile memory voltage supply, and the analog voltage supply) on the SOC device to the bandgap reference. If the voltages of the monitored supplies do not compare favorably with the reference voltage (i.e., are outside a predetermined error range), the voltage monitoring circuit may output a signal indicating the problem. The output error signal could be used to delay start-up, trigger power down, generate one or more resets, assert an interrupt, or shut down operation of the SOC device.

A voltage reference circuit 146 included in the system controller circuit may be, for example, a bandgap reference circuit like the one described previously with reference to FIG. 13, or other type of circuit known in the art for supplying an accurate reference voltage. A bandgap reference circuit provides an absolute voltage output for reference by other circuits on the SOC device. Other power supplies can be compared to the reference voltage, as described above. The voltage reference circuit 146 may include other circuitry, for example, operational amplifiers and buffers to change the level of the voltage. Bandgap voltage reference circuits other than the one illustrated in FIG. 13 may be used in other embodiments of the invention, such as, for example a bandgap voltage reference circuit available from QualCore Logic, Inc, of Sunnyvale, Calif. that may be adapted for use in the particular SOC device. This bandgap voltage reference circuit may be separate from the general bandgap voltage source used for other circuit blocks on the SOC device, such as the programmable logic block, in order to provide a high-precision voltage input for components such as the ADC circuit, and to reduce the risk of coupling noise from other circuits.

The power-up control circuit 142 controls the internal power-up sequence of the SOC device. The power-up sequence is used to insure that circuits receive the proper initialization, in the proper order, as power is supplied to the device. A typical power-up sequence is shown in the state-machine diagram of FIG. 15A. Use of such a sequence reduces the chance for errors or damage to the SOC device resulting from circuits operating at an improper voltage (e.g., insufficient voltage or excessive voltage due to a spike) or to an improper sequence (e.g., an active circuit trying to communicate with a circuit that is not yet initialized. The power-up control circuit 142 includes circuits that determine whether sufficient voltage is present to activate a circuit during power-up. These circuits can also be used to monitor the same voltages during operation of the SOC device, in addition to monitoring voltages during power-up. A timing diagram showing a typical startup sequence is shown in FIG. 15B.

A power-up control circuit 142 implementing a power-up sequence such as the example described herein may be implemented in hardwired circuitry, or a combination of hardwired circuitry and programmable logic. As is known in the art, regulator circuits, charge pumps, voltage reference generators, etc. must be implemented in hardwired circuits, while sequence and control circuits may be implemented in hardwired circuits or programmed in programmable logic, as long as they are not required to be used before the programmable logic block is active.

Figure 16:
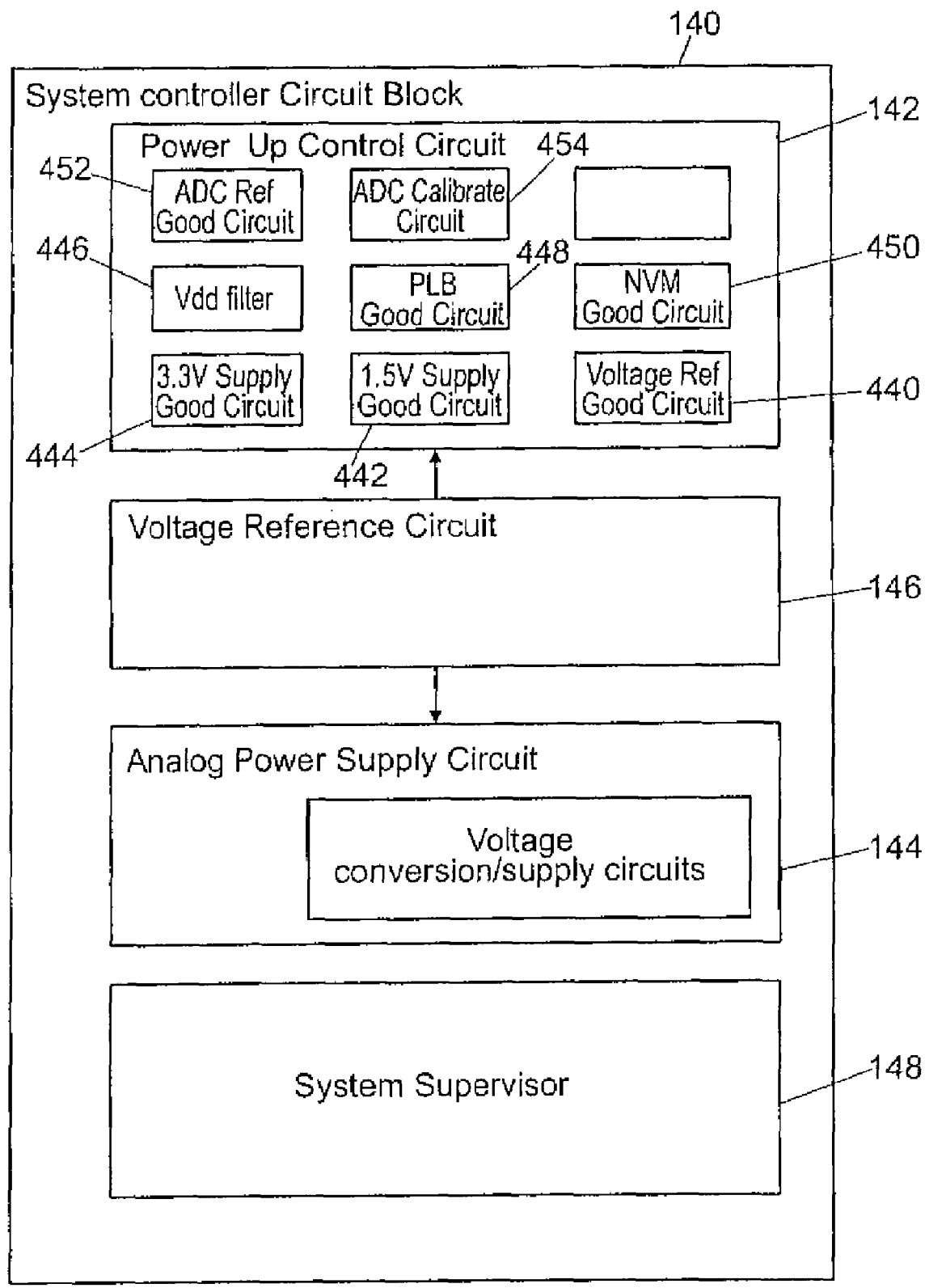
FIG. 16 is a more detailed block diagram of the system supervisor master block from FIG. 5.

As shown in FIG. 16, a more detailed block diagram of system supervisor master block 140 from FIG. 5, the power-up control circuit 142 is shown to be comprised of circuits employing standard circuit elements to provide signals to activate various elements of the SOC device when the proper conditions are met (e.g., timing, sufficient voltage, etc.). In the embodiment shown in FIG. 16, the power-up control circuit includes a voltage-reference-good circuit 440 for indicating that the circuit supplying the reference voltage is active and functioning within predetermined parameters. The power-up control circuit also includes circuits 442 and 444 for indicating that each voltage supply (3.3V and 1.5V, in the example shown) is good (meaning active and functioning within predetermined parameters). The power-up control circuit may also include voltage filter circuits for filtering voltages supplied to various components of the SOC device, such as, for example, the Vdd filter circuit 446 shown in FIG. 16.

In addition to verifying and managing the power supplies, the power-up control circuit includes circuitry for activating various components of the SOC device such as the programmable logic block (circuit 448) and the non-volatile memory block (circuit 410), determining whether the component has become active, and outputting a signal to indicate that the circuit has become active. The signal indicating that a component is active may be used to activate the next step in the power-up sequence. Also shown in FIG. 16 are circuits for managing the power-up functions of the ADC. Specifically, the ADC-reference-good circuit 412 indicates that the reference voltage input to the ADC is accurate, and ADC-calibrate circuit 414 to indicates that the ADC is calibrated.

The particular circuits used in actual embodiments of the present invention embodiments will depend on the particulars of the programmable logic, memory, analog, and digital hardwired blocks employed in the particular device. Examples of standard circuits that may be adapted to perform the power-up control functions are multiplexers, control circuits, power monitor circuits, crystal oscillators, bandgap reference circuits, operational amplifiers, instrument amplifiers, charge pumps, filters, power supply regulators, known in the art and available from circuit design and IP licensing companies such as QualCore Logic, Inc., Sunnyvale, Calif.; TriCN, Inc., San Francisco, Calif.; or SliceX, Inc., Salt Lake City, Utah.

Figure 17:
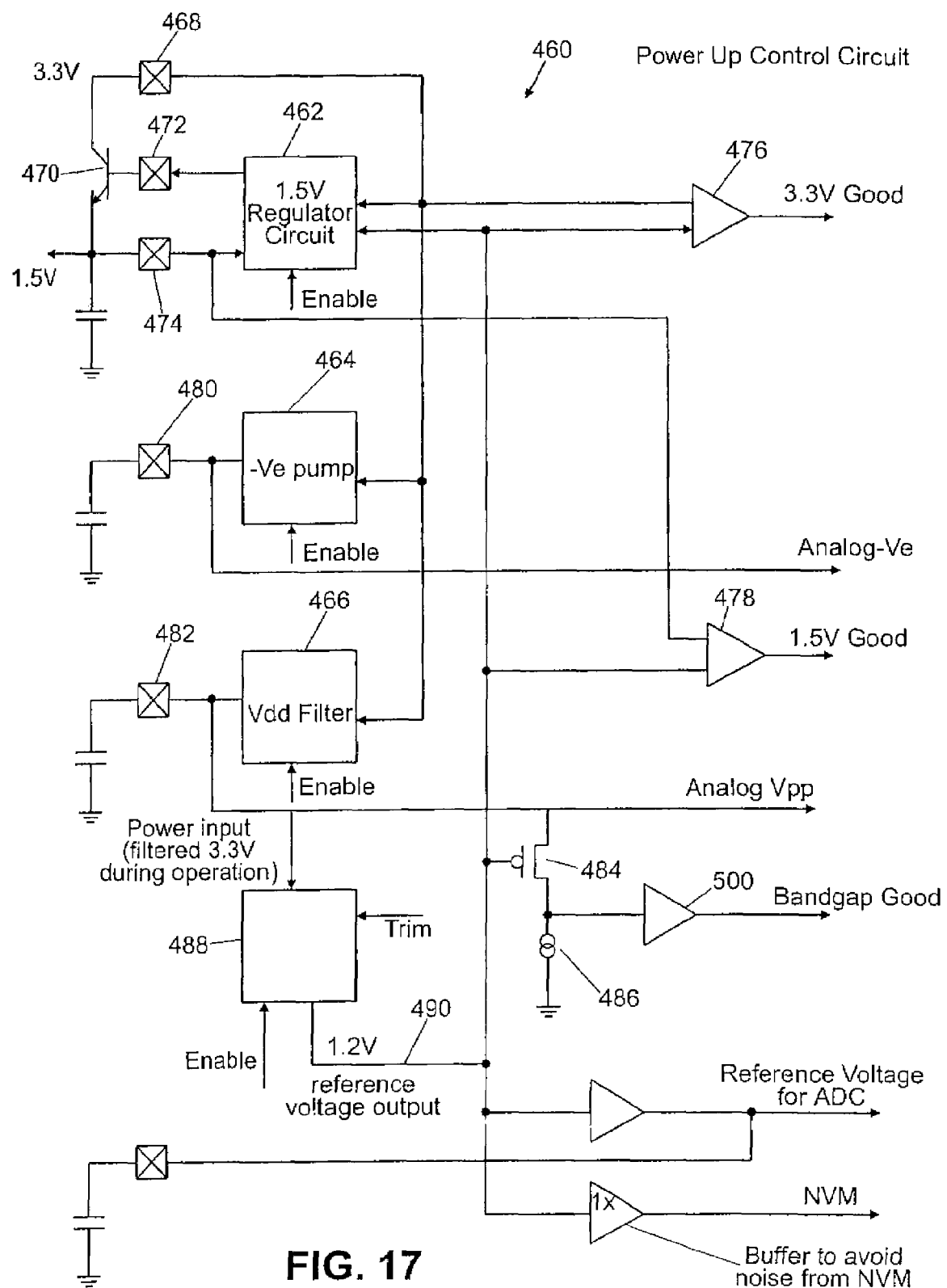
FIG. 17 is a diagram illustrating a portion of the power-up control circuit for performing functions early in the power-up sequence.

FIG. 17 shows a portion of the power-up control circuit 460 for performing functions early in the power-up sequence. Also shown in FIG. 17 is the voltage reference (bandgap) circuit of FIG. 13 in communication with the power-up circuits. For illustration purposes, the power-up circuits shown in FIG. 17 are a 1.5 volt regulator circuit 462 for supplying 1.5 volts to the digital circuitry of the SOC device, a −Ve charge pump circuit 464 for supplying a negative voltage for the hardwired analog circuits of the SOC device, and a Vdd filter circuit 466 for providing a filtered 3.3 volt source to circuits requiring a filtered voltage (e.g., the bandgap voltage regulator circuit).

More particularly, 3.3V is supplied to the SOC through I/O pad 468 and is supplied to 1.5 volt regulator circuit 462 as shown. As can be seen from FIG. 17, I/O pad 468 is also coupled to −Ve charge pump circuit 464 and to Vdd filter circuit 466. The 1.5V output of 1.5 volt regulator circuit 462 drives the base of external emitter-follower NPN transistor 470 through I/O pad 472. The output of the external transistor 470 is fed back to 1.5 volt regulator circuit 462 via I/O pad 474. Comparator 476 produces the 3.3V supply good signal when the voltage on I/O pad 474 is above the value set by the voltage from the 1.5 volt regulator 462. Comparator 478 produces the 1.5V supply good signal when the voltage on I/O pad 474 is above a preset value derived from the voltage at I/O pad 474.

The output of −Ve charge pump circuit 464 is presented at I/O pad 480 and the output of Vdd filter circuit 466 is presented at I/O pad 482.

Figure 15A:
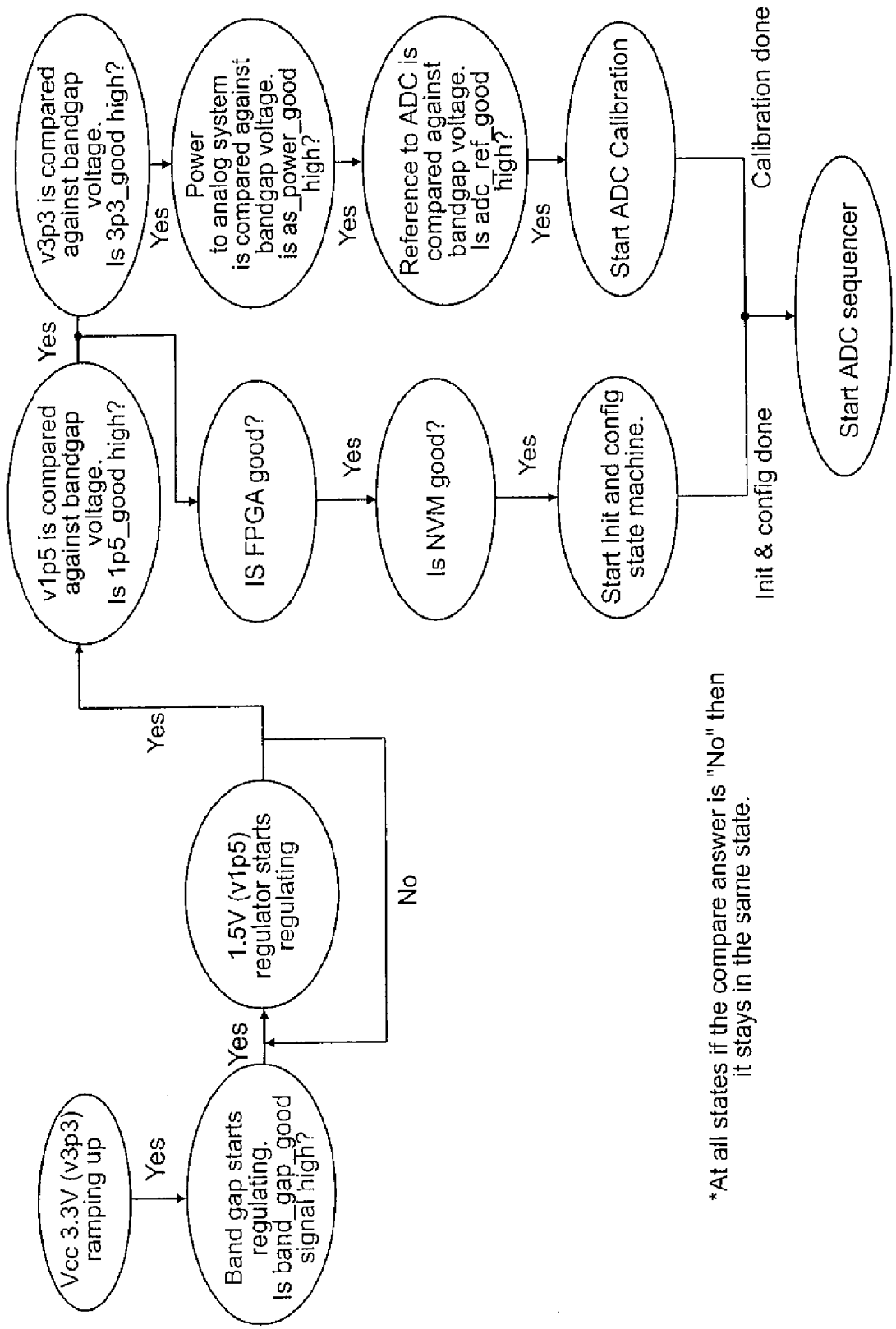
FIG. 15A is a power-up sequence state-machine flow chart showing a typical SOC internal power up sequence.
Figure 15B:
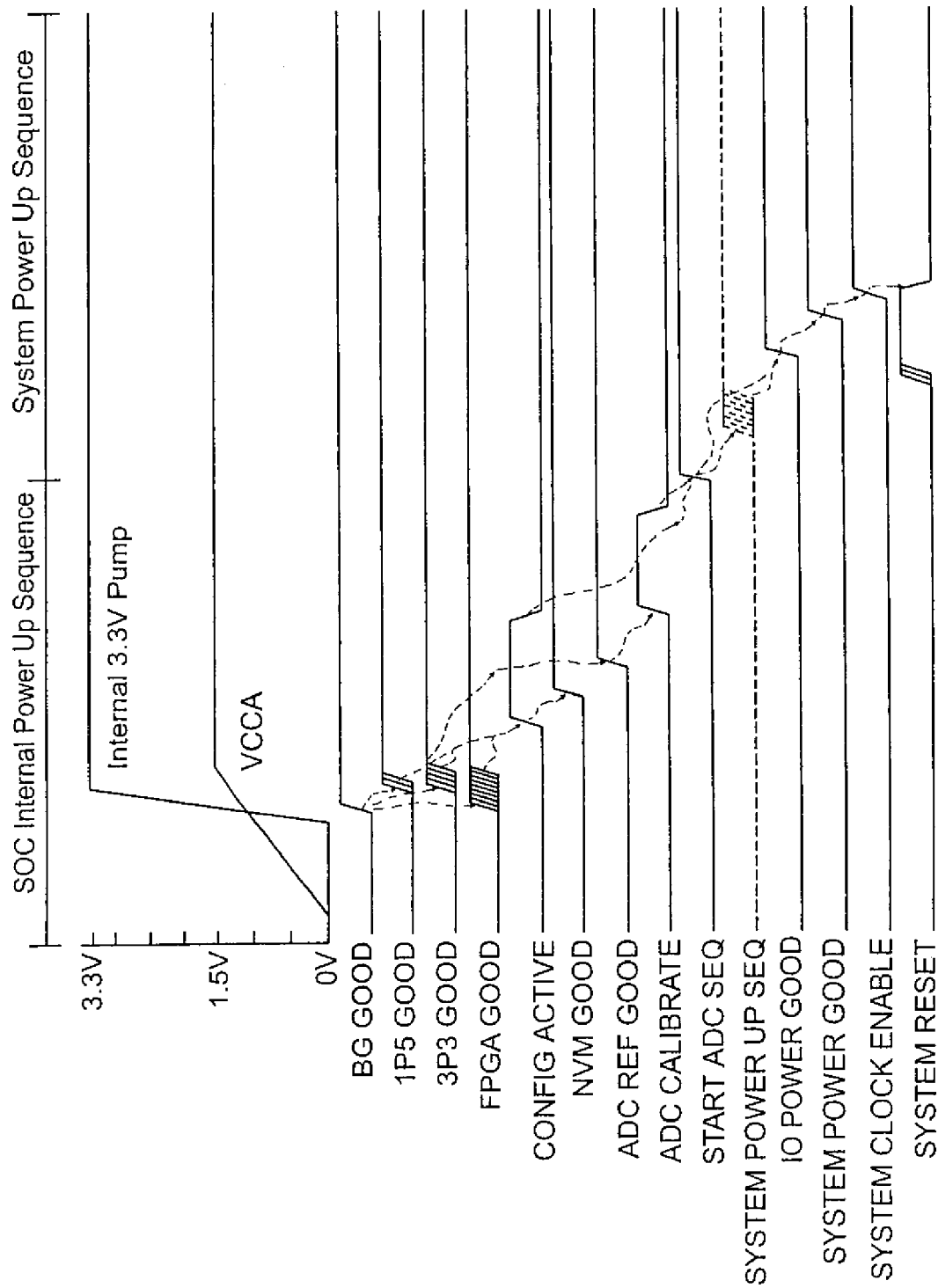
FIG. 15B is a timing diagram showing a typical SOC internal power up sequence.

As shown in the power-up sequence flow chart of FIG. 15A, the first signal produced in the power-up sequence is the bandgap-good signal. This signal indicates that the bandgap reference circuit is outputting the accurate, regulated voltage for which it is designed. Since this voltage is the reference for the other circuits on the device, it is the first required to be operational during power-up. As power input to the bandgap circuit increases during power-up, the voltage output by the bandgap circuit almost exactly matches the input voltage until the input voltage rises above the voltage the bandgap circuit is designed to output ("reference voltage"). The reference voltage for the device is generally below the input voltage (Vcc) of the SOC device. For example, the reference voltage for the SOC device may be 1.2V where Vcc for the SOC device is 3.3 volts.

The portion of the power-up control circuit shown in FIG. 17 also includes a threshold p-channel MOS transistor 484 and a small current source 486 for indicating when the bandgap reference circuit 488 is outputting the correct bandgap output voltage. In the example shown in FIG. 17, the bandgap circuit 488 receives a voltage input from the Vdd filter circuit 466 and outputs a controlled voltage via an output 490. The source of threshold transistor 484 is coupled to the Vdd filter circuit output, and a buffer 500 and the current source 486 are connected to the drain of threshold transistor 484. The gate of the threshold transistor 484 is connected to the bandgap output 490. In this configuration, the threshold transistor 484 will turn on when the voltage input to the bandgap circuit 488 exceeds the bandgap circuit output by the threshold of the p-channel threshold transistor 484. Once the threshold transistor 484 turns on, current flows through the threshold transistor 484 and the bandgap-good signal is activated, via the buffer 500. This insures that the bandgap circuit 488 will not be indicated as active until it is outputting the proper reference voltage.

The threshold of the threshold transistor 484 may be designed to a predetermined value by varying the geometry and materials of the transistor, as is known in the art. Although the exact threshold may vary with temperature, the transistor can be designed so any variance will not interfere with the basic functionality of the circuit. This functionality can be maintained as long as the general input voltage for the device sufficiently exceeds the reference voltage. A small current source 486, on the order of 1 µA, connected between the buffer 500 and ground insures that the current through the threshold transistor 484 is sufficient before the bandgap good signal is activated at the output of buffer 500. Once the bandgap good signal is activated, indicating that there is an accurate reference voltage available on the device, the other circuits in the power-up control circuit can begin their operations, for example, by comparing their input voltages to the known good reference voltage.

The system controller circuit block 140 also includes a system supervisor circuit. The system supervisor circuit may be implemented in hardwired circuits, programmed into programmable logic, or a combination of both. The system supervisor circuit block 148 manages on-chip and off-chip signals following the power-up of the SOC device. Once the SOC device is powered up and active, the system supervisor circuit block may perform power-up management of the system of which the SOC device of the present invention is a part, and provide other system management functions such as managing voltage monitoring circuits to monitor system voltages during operation. The system supervisor block may communicate with off-chip devices via, for example, a hardwired JTAG interface circuit block 124 included in the system controller circuit block 140, a hardwired interface designed in accordance with another interface standard, or via the general purpose I/Os of the SOC device.

The system supervisor 148 may use, for example, known circuits such as a microprocessor, a microcontroller, or a system control state machine that are either hardwired or programmed into the programmable logic portion of the SOC device using circuit design and programming techniques known to those skilled in the art. These known circuits perform system management functions such as power-up sequencing of off-chip devices, system clock enabling, and system reset, as is known to those skilled in the art. In addition, known level compare circuits, filter circuits, and external device control circuits may be implemented in either programmable logic, or hardwired into the SOC device to add functionality to the system controller. The particular embodiments of the system supervisor circuit will be highly dependent on the user system, and therefore it is desirable to implement much of the circuit in programmable logic. For example, different user systems may have different numbers of power supplies, operating at various voltages, to be monitored. The user can configure the system supervisor circuit to accommodate the parameters of the user's particular system.

For example, the system supervisor circuit 148 may be configured to include a specialized microcontroller-type circuit for power-up and power monitoring called an ADC sequencer circuit. System voltages, as well as the reference voltage, may be input to the ADC, which converts the voltages to digital values that are input to the programmable logic block. An ADC sequencer circuit programmed into the programmable logic block may compare the digital values and use the results to control system elements via signals output from the SOC device (e.g., power-up enable signals, etc.).

According to another aspect of the present invention, a system-on-a-chip integrated circuit as disclosed herein includes input pads that may be used for both analog and digital signals. This aspect of the present invention is best understood with reference to FIGS. 7 through 10 herein, FIGS. 18-20 and related text in co-pending application Ser. No. 10/850,568, filed May 19, 2004, now issued as U.S. Pat. No. 7,256,610, and FIGS. 18-24 and related text in co-pending application Ser. No. 10/850,054, filed May 19, 2004, now issued as U.S. Pat. No. 7,034,569, all of which are expressly incorporated by reference herein.

Figure 18:
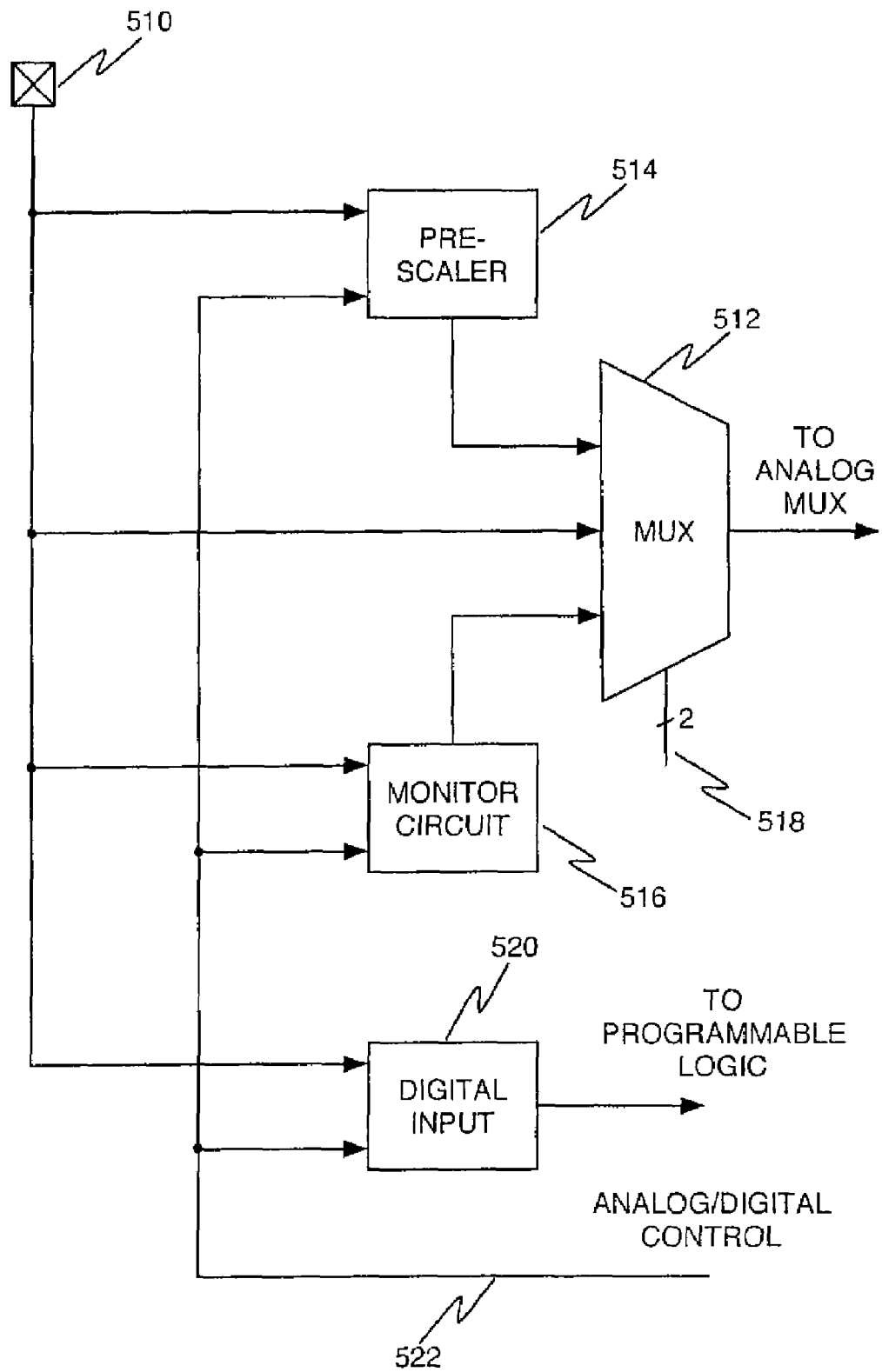
FIG. 18 is a block diagram of a portion of a system-on-a-chip integrated circuit including a dual-purpose analog and digital input according to one aspect of the present invention.

More specifically, the illustrative multi-member set of analog I/O circuits shown in FIG. 7 including members 180, 190, 210 includes this feature of the present invention. FIG. 18 is a block diagram of a portion of a system-on-a-chip integrated circuit including a dual-purpose analog and digital input according to one aspect of the present invention. FIG. 18 is a generalization of the members 180, 190, 210 of the set of analog I/O circuits of FIG. 7, in which I/O pad 510 is primarily used for analog input functions and supplies an analog input to multiplexer 512, either directly or through pre-scaler circuit 514 or analog monitor circuit 516. Multiplexer 512 is controlled by a pair of control lines 518. In addition, I/O pad 510 can supply a digital input to digital input circuit 520. An analog/digital control line 522 is used to select between the analog input function and the digital input function for I/O pad 510.

Figure 19:
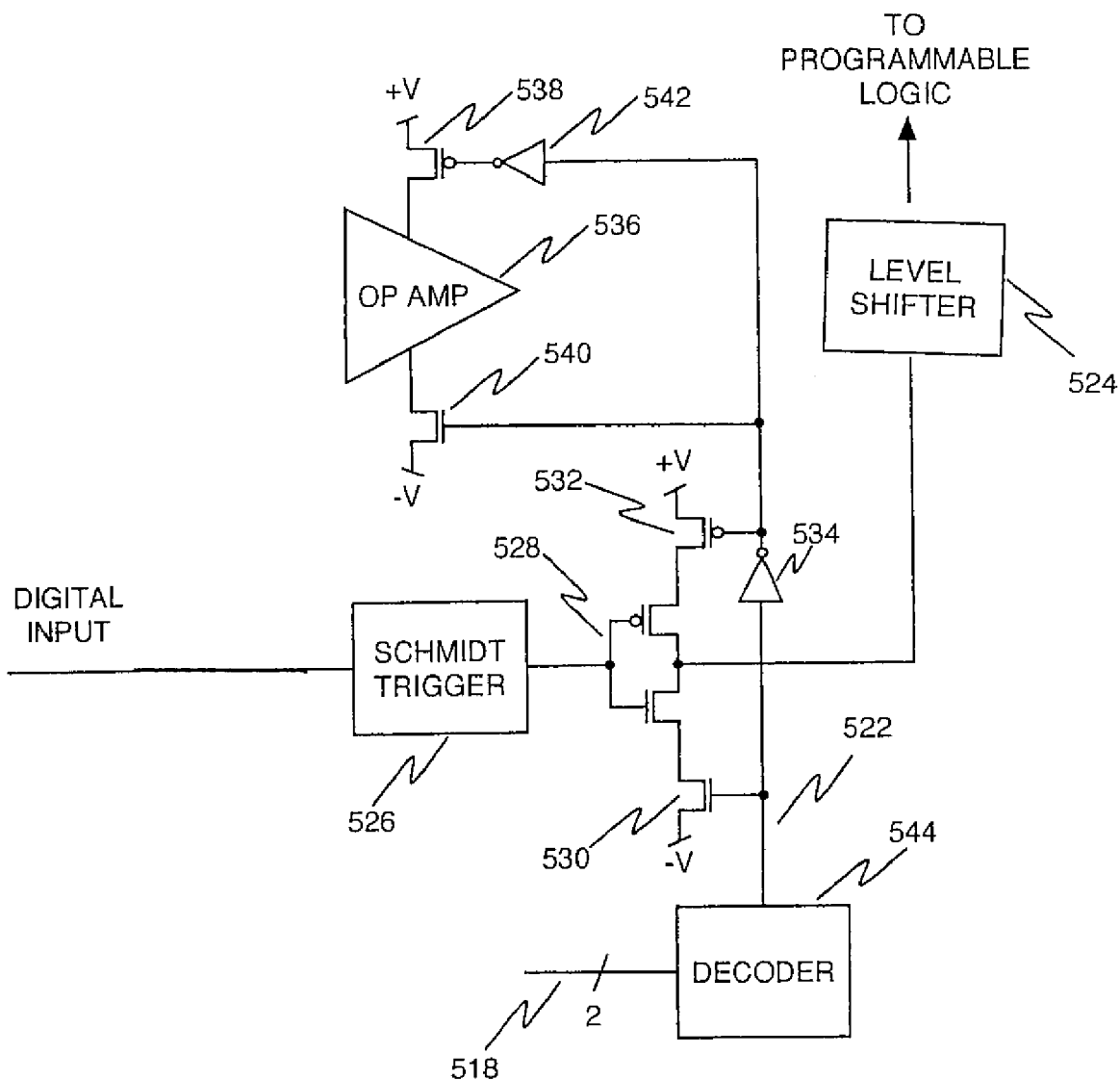
FIG. 19 is a diagram of a control arrangement for selecting between a digital input function and an analog input function on an input pad of a system-on-a-chip integrated circuit according to the aspect of the present invention illustrated in FIG. 18.

Referring now to FIG. 19, a diagram shows an illustrative control arrangement for selecting between the digital input and analog input functions for I/O pad 510 of the circuit of FIG. 19. Digital input 520 of FIG. 18 is seen in FIG. 19 to include level-shifter circuit 524 and Schmidt trigger circuit 526. As is known in the art, circuits 524 and 526 perform the function of converting logic levels from different logic families to the logic levels used inside of the SOC and conditioning the input rise and fall times of the digital signals that may be applied to I/O pad 510 of FIG. 18. If desired, level-shifter circuit 524 can be made programmable to accommodate different input levels.

Inverter 528 is a conventional inverter including a p-channel MOS transistor in series with a n-channel MOS transistor and acts as an input buffer. According to one aspect of the present invention, inverter 528 may be configured to have a slower bandwidth (such as 10 MHz) than the other digital circuitry on the SOC. This is especially useful where the analog/digital input control is located close to the analog circuitry and can act to minimize digital noise transfer into the analog circuits. The sources of the p-channel MOS transistor and the n-channel MOS transistor are coupled to the +V and −V power rails through p-channel MOS transistor 532 and n-channel MOS transistor 534, respectively. The gate of n-channel MOS transistor 534 is coupled directly to analog/digital control line 522 of FIG. 18, and the gate of p-channel MOS transistor 532 is coupled to analog/digital control line 522 through inverter 534.

Operational amplifier 536 represents any one of the operational amplifiers used in the circuits that have been described in FIG. 7 and related drawing figures. Persons of ordinary skill in the art will appreciate that the circuit of FIG. 19 could be used to enable or disable all of the operational amplifiers in the analog circuit when the digital input function is selected.

As shown in FIG. 19, operational amplifier 536 is coupled to the +V and −V power rails through p-channel MOS transistor 538 and n-channel MOS transistor 540, respectively. P-channel MOS transistor 538 has its gate directly coupled to the output of inverter 534 through inverter 542 and n-channel MOS transistor 540 has its gate directly coupled to the output of inverter 534.

Decoder 544 has inputs coupled to the 2-line control input of multiplexer 512 of FIG. 18. Three of the four possible input states of these control lines that select between I/O pad 510, the output of pre-scaler circuit 514, or the output of analog monitor circuit 520 will cause a logic low to appear at the output of decoder 544, turning off transistors 530 and 532, and turning on transistors 538 and 540. This disables the digital input and supplies power to the operational amplifiers in the analog section. The last of the four possible input states of these control lines will cause a logic high to appear at the output of decoder 544, turning on transistors 530 and 532, and turning off transistors 538 and 540. This enables the digital input and disables power to the operational amplifiers in the analog section. Persons of ordinary skill in the art will realize that individual operational amplifiers associated with the pre-scaler circuit 514, or the analog monitor circuit 520 can be individually decoded and enabled in order to conserve chip power.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An integrated circuit comprising:
   a plurality of inputs;
   a plurality of outputs;
   a programmable logic block;
   an analog circuit block coupled to at least one of the inputs, the analog circuit block including at least one hardwired analog function circuit;
   an analog-to-digital converter programmably coupleable to individual analog circuits in the analog circuit block;
   a digital circuit block coupled to at least one of the inputs, the digital circuit block including at least one hardwired digital function circuit;
   an interconnect architecture programmably coupling selected ones of the plurality of inputs, the plurality of outputs, the programmable logic block, the analog circuit block, and the analog-to-digital converter;
   wherein at least one of the inputs may be programmably configured as one of a digital input programmably coupleable to elements in the programmable logic block or as an analog input to an analog circuit in the analog circuit block.

2. The integrated circuit of claim 1 wherein the at least one of the inputs may be programmably configured as a digital input programmably coupleable to elements in the programmable logic block with a slew rate less than about 10MHz.

3. The integrated circuit of claim 1 wherein:
   the at least one hardwired analog function circuit includes at least one of a digital-to-analog converter, an analog-to-digital converter, an analog pulse width modulator, a MOSFET controller, a voltage reference circuit, a low-dropout regulator, an analog multiplexer, and an RF transceiver; and
   the at least one hardwired digital function circuit includes at least one of a state machine, analog sequencer, microprocessor, digital signal processor, and interface circuit.

4. The integrated circuit of claim 1 further including:
at least one operational amplifier in the at least one analog function circuit;
a programmable coupling circuit to selectively couple at least one of the inputs to the programmable logic block;
wherein the programmable coupling circuit interrupts power to the at least one operational amplifier when the coupling circuit is programmed to couple the at least one of the inputs to the programmable logic block.

5. The integrated circuit of claim 1 further including a clock system including a clock generator having multiple clock sources.

6. The integrated circuit of claim 1 wherein the multiple clock sources include a crystal oscillator and at least one RC oscillator.

7. The integrated circuit of claim 1 wherein the clock system includes at least one phase locked loop.

8. The integrated circuit of claim 1 wherein the at least one analog function circuit includes an analog-voltage pre-scaler circuit and the programmable coupling circuit includes a multiplexer having a first input coupled to the at least one of the inputs, a second input coupled to the at least one of the inputs through the analog-voltage pre-scaler circuit, and at least one programmable select input.

9. The integrated circuit of claim 1 wherein the coupling circuit includes at least one first MOS transistor coupled between a power rail and a power input on the at least one operational amplifier, and at least one second MOS transistor coupled between a power rail and a digital buffer coupled between the at least one of the inputs and the programmable logic block, the at least one first and second MOS transistors controlled by a decoder.

10. The integrated circuit of claim 9 wherein the decoder is driven by data on the at least one programmable select input of the multiplexer.

11. The integrated circuit of claim 1 wherein the coupling circuitry has a maximum digital bandwidth of less than about 10 MHz.

* * * * *